United States Patent
Mitchell et al.

(10) Patent No.: US 7,893,531 B2
(45) Date of Patent: Feb. 22, 2011

(54) INTEGRATED-CIRCUIT PACKAGE FOR PROXIMITY COMMUNICATION

(75) Inventors: James G. Mitchell, Palo Alto, CA (US); John E. Cunningham, San Diego, CA (US); Ashok V. Krishnamoorthy, San Diego, CA (US)

(73) Assignee: Oracle America, Inc., Redwood Shores, CA (US)

(*) Notice: Subject to any disclaimer, the term of this patent is extended or adjusted under 35 U.S.C. 154(b) by 195 days.

(21) Appl. No.: 11/864,408

(22) Filed: Sep. 28, 2007

(65) Prior Publication Data

US 2009/0085183 A1   Apr. 2, 2009

(51) Int. Cl.
*H01L 23/34* (2006.01)

(52) U.S. Cl. ............... 257/727; 257/E23.18; 257/686; 257/704

(58) Field of Classification Search ............... 257/726, 257/686, 704, 727, E23.18
See application file for complete search history.

(56) References Cited

U.S. PATENT DOCUMENTS

| | | | |
|---|---|---|---|
| 5,804,875 A * | 9/1998 | Remsburg et al. | 257/718 |
| 6,495,396 B1 | 12/2002 | Drost | |
| 2004/0145063 A1 * | 7/2004 | Sutherland et al. | 257/777 |
| 2006/0017150 A1 | 1/2006 | Zingher | |
| 2007/0075442 A1 | 4/2007 | Krishnamoorthy | |

FOREIGN PATENT DOCUMENTS

| | | |
|---|---|---|
| EP | 1443559 A2 | 8/2004 |
| EP | 1650801 A2 | 9/2005 |
| WO | 2006050446 A1 | 5/2006 |

* cited by examiner

*Primary Examiner*—David A Zarneke
*Assistant Examiner*—Jenny L Wagner
(74) *Attorney, Agent, or Firm*—Park, Vaughan, Fleming & Dowler LLP

(57) ABSTRACT

Embodiments of a multi-chip module (MCM) are described. This MCM includes a first semiconductor die and a second semiconductor die, where a given semiconductor die, which can be the first semiconductor die or the second semiconductor die, includes proximity connectors proximate to a surface of the given semiconductor die. Moreover, the given semiconductor die is configured to communicate signals with the other semiconductor die via proximity communication through one or more of the proximity connectors. Furthermore, the MCM includes an alignment plate and a top plate coupled to the alignment plate. This alignment plate includes a first negative feature configured to accommodate the first semiconductor die and a second negative feature configured to accommodate the second semiconductor die, and the top plate includes a positive feature. Note that the positive feature is coupled to the first semiconductor die, and the positive feature facilitates mechanical positioning of the first semiconductor die.

19 Claims, 14 Drawing Sheets

```
                                                                                    ┌─ 1400

┌─────────────────────────────────────────────────────────────────────────┐
  │  POSITION A FIRST SEMICONDUCTOR DIE INTO A FIRST NEGATIVE FEATURE IN    │
  │    AN ALIGNMENT PLATE IN AN MCM, WHERE THE POSITIONING INVOLVES         │
  │    COUPLING THE FIRST SEMICONDUCTOR DIE TO A BASE PLATE IN THE MCM      │
  │                      USING FIRST COUPLING ELEMENTS                      │
  │                                  1410                                   │
  └─────────────────────────────────────────────────────────────────────────┘
                                        │
                                        ▼
  ┌─────────────────────────────────────────────────────────────────────────┐
  │     POSITION A SECOND SEMICONDUCTOR DIE INTO A SECOND NEGATIVE          │
  │   FEATURE IN THE ALIGNMENT PLATE, WHERE THE POSITIONING INVOLVES        │
  │   COUPLING THE SECOND SEMICONDUCTOR DIE TO THE BASE PLATE USING         │
  │                       SECOND COUPLING ELEMENTS                          │
  │                                  1412                                   │
  └─────────────────────────────────────────────────────────────────────────┘
                                        │
                                        ▼
  ┌─────────────────────────────────────────────────────────────────────────┐
  │   COUPLE THE FIRST SEMICONDUCTOR DIE TO THE SECOND SEMICONDUCTOR        │
  │  DIE USING THIRD COUPLING ELEMENTS, WHERE GIVEN COUPLING ELEMENTS,      │
  │      WHICH CAN INCLUDE THE FIRST COUPLING ELEMENTS, THE SECOND          │
  │     COUPLING ELEMENTS, OR THE THIRD COUPLING ELEMENTS, FACILITATE       │
  │  ALIGNING OF PROXIMITY CONNECTORS PROXIMATE TO A FIRST SURFACE OF       │
  │   THE FIRST SEMICONDUCTOR DIE WITH PROXIMITY CONNECTORS PROXIMATE       │
  │         TO A SECOND SURFACE OF THE SECOND SEMICONDUCTOR DIE             │
  │                                  1414                                   │
  └─────────────────────────────────────────────────────────────────────────┘
```

FIG. 14

INTEGRATED-CIRCUIT PACKAGE FOR PROXIMITY COMMUNICATION

GOVERNMENT LICENSE RIGHTS

This invention was made with United States Government support under Contract No. NBCH3039002 awarded by the Defense Advanced Research Projects Administration. The United States Government has certain rights in the invention.

CROSS REFERENCE TO RELATED APPLICATIONS

This application is related to pending U.S. patent application Ser. No. 11/243,300, filed on Oct. 3, 2005, the contents of which are herein incorporated by reference.

BACKGROUND

1. Field of the Invention

The present invention relates to techniques for packaging integrated circuits. More specifically, the present invention relates to a multi-chip module that facilitates inter-chip proximity communication.

2. Related Art

Advances in semiconductor technology presently make it possible to integrate large-scale systems, which can include hundreds of millions of transistors, into a single semiconductor chip (or die). Integrating such large-scale systems onto a single semiconductor chip increases the speed at which such systems can operate, because signals between system components do not have to cross chip boundaries, and are not subject to lengthy chip-to-chip propagation delays. Moreover, integrating large-scale systems onto a single semiconductor chip significantly reduces production costs, because fewer semiconductor chips are required to perform a given computational task.

Unfortunately, these advances in semiconductor technology have not been matched by corresponding advances in inter-chip communication technology. Semiconductor chips are typically integrated onto a printed circuit board that contains multiple layers of signal lines for inter-chip communication. However, signal lines on a semiconductor chip are about 100 times more densely packed than signal lines on a printed circuit board. Consequently, only a tiny fraction of the signal lines on a semiconductor chip can be routed across the printed circuit board to other chips. This problem has created a bottleneck that continues to grow as semiconductor integration densities continue to increase.

Researchers have begun to investigate alternative techniques for communicating between semiconductor chips. One promising technique involves integrating arrays of capacitive transmitters and receivers onto semiconductor chips to facilitate inter-chip communication. If a first chip is situated face-to-face with a second chip so that transmitter pads on the first chip are capacitively coupled with receiver pads on the second chip, the first chip can directly transmit signals to the second chip without having to route the signals through intervening signal lines within a printed circuit board.

Capacitive coupling requires precise alignment between the transmitter pads and the receiver pads (which are more generally referred to as proximity connectors), both in a plane defined by the pads and in a direction perpendicular to the plane. Misalignment between the transmitter pads and the receiver pads may cause each receiving pad to span two transmitting pads, thereby destroying a received signal. In theory, for communication to be possible, chips must be aligned so that misalignment is less than half of a pitch between the pads. In practice, the alignment requirements may be more stringent. In addition, reducing misalignment can improve communication performance between the chips and reduce power consumption.

Unfortunately, it can be very challenging to align chips properly. Existing approaches include mechanical mounting structures that facilitate self-alignment and/or self-adjustment of pad positions. FIG. 1 illustrates one such approach in which negative features, such as etch pits 112, and micro-spheres 114 are used to align semiconductor dies 110 (and thus proximity connectors) in a multi-chip module (MCM). These etch-pits can be defined photolithographically using a subtractive process (i.e., a photolithographic process that removes material), which takes place before, during, or after circuit fabrication on the semiconductor dies 110. This enables the etch pits 112 to be accurately placed on the semiconductor dies 110 in relationship to circuits and the proximity connectors. Therefore, the photolithographic alignment between the etch pits 112 and circuits establishes precise alignment between circuits on the top and bottom semiconductor dies 110.

Note that the alignment in the X, Y, and Z directions, as well as the angular alignment between semiconductor dies 110, depends only on the relative sizes of the etch-pits 112 and the micro-spheres 114, and on the orientation and placement of the etch pits 112 on the semiconductor dies 110. In particular, the lateral alignment between circuits on the semiconductor dies 110 is achieved in a 'snap-fit' manner, provided the micro-spheres 114 are appropriately sized to fit into the etched pits 112. Clearly, micro-spheres 114 that are too large do not fit into the etch pits 112, and micro-spheres 114 that are too small do not properly align the top and bottom semiconductor dies 110. However, if the micro-spheres 114 sit in the groove of the etch pits 112 correctly (for example, their equators lie exactly at or higher than the surface of the semiconductor die 110-1 and exactly at or lower than the surface of semiconductor die 110-2) then circuits on the top and bottom semiconductor dies 110 are precisely aligned. Similarly, alignment in the Z direction is a function of the photolithographic feature size of the etch pits 112, the etch depth of the etch pits 112, and the diameter of the micro-spheres 114.

While this approach is useful and applicable to packaging and assembly of MCMs that include two or more semiconductor dies 110, it suffers from the limitation that the placement of micro-spheres 114 into the etch-pits 112 is not a parallel, wafer-scale process that can be readily performed at a foundry. Instead, the micro-spheres 114 are often placed into individual semiconductor dies 110 after fabrication. Consequently, this approach may add complexity and cost to the process of assembling MCMs.

Moreover, proximity communication poses addition challenges in the design and assembly of MCMs, including: providing power to the chips; effectively cooling the chips; interfacing the MCMs to external input/output (I/O) mechanisms; testing; reliability in the presence of perturbations, such as thermal stress, vibration, and mechanical shock; and the ability to rework MCMs to repair and/or replace components that do not work.

Hence, what is needed is a method and an apparatus that facilitates proximity communication without the problems listed above.

SUMMARY

One embodiment of the present invention provides a multi-chip module (MCM). This MCM includes a first semiconductor die and a second semiconductor die, where a given semiconductor die, which can be the first semiconductor die or the second semiconductor die, includes proximity connectors proximate to a surface of the given semiconductor die. Moreover, the given semiconductor die is configured to communicate signals with the other semiconductor die via proximity communication through one or more of the proximity connectors. Furthermore, the MCM includes an alignment plate and a top plate coupled to the alignment plate. This alignment plate includes a first negative feature configured to accommodate the first semiconductor die and a second negative feature configured to accommodate the second semiconductor die, and the top plate includes a positive feature. Note that the positive feature is coupled to the first semiconductor die, and the positive feature facilitates mechanical positioning of the first semiconductor die.

In some embodiments, the mechanical positioning defines relative positions of the proximity connectors proximate to the surface of the first semiconductor die and the proximity connectors proximate to the surface of the second semiconductor die. Note that the relative positions are within a first pre-determined distance in a plane which includes the proximity connectors proximate to the surface of the first semiconductor die, and the relative positions are within a second pre-determined distance in a direction which is substantially perpendicular to the plane.

In some embodiments, the MCM includes a component coupled to the proximity connectors proximate to the surface of the first semiconductor die and coupled to the proximity connectors proximate to the surface of the second semiconductor die. This component may be coupled to the given semiconductor die using first coupling elements. For example, the first coupling elements may include micro-spheres.

In some embodiments, the surface of the first semiconductor die faces the surface of the second semiconductor die. However, in some embodiments the surface of the first semiconductor die and the surface of the second semiconductor die both face in the same direction.

In some embodiments, the proximity communication includes optical communication. Moreover, in some embodiments the proximity connectors proximate to the surface of the first semiconductor die are capacitively coupled to the proximity connectors proximate to the surface of the second semiconductor die.

In some embodiments, the positive feature includes a protrusion, and at least a portion of the protrusion has a pyramidal shape. Moreover, a given negative feature, which can include the first negative feature or the second negative feature, includes a depression, and at least a portion of the depression has a pyramidal shape.

In some embodiments, the MCM includes a base plate coupled to the alignment plate, where the first semiconductor die is coupled to the base plate using second coupling elements which facilitate the mechanical positioning. These second coupling elements may include micro-spheres. In some embodiments, the micro-spheres are positioned into depressions in the base plate and depressions in the alignment plate. Moreover, the second coupling elements may facilitate an orientation of the first semiconductor die.

In some embodiments, the base plate is configured to cool from the first semiconductor die.

In some embodiments, the first semiconductor die is coupled to the second semiconductor die using third coupling elements which facilitate the mechanical positioning. These third coupling elements may include micro-spheres.

In some embodiments, the top plate includes first connectors having a first size on a first surface of the top plate and second connectors having a second size on a second surface of the top plate. Note that the top plate is configured to couple the first connectors to the given semiconductor die and to couple the first connectors to second connectors. Furthermore, the second size is larger than the first size.

Another embodiments provides a method for assembling the MCM. During this process, a first semiconductor die is positioned into a first negative feature in the alignment plate in the MCM, where the positioning involves coupling the first semiconductor die to the base plate in the MCM using fourth coupling elements. Then, a second semiconductor die is positioned into a second negative feature in the alignment plate, where the positioning involves coupling the second semiconductor die to the base plate using fifth coupling elements. Next, the first semiconductor die is coupled to the second semiconductor die using third coupling elements. Note that given coupling elements, which can include the first coupling elements, the second coupling elements, or the third coupling elements, facilitate aligning of proximity connectors proximate to a first surface of the first semiconductor die with proximity connectors proximate to a second surface of the second semiconductor die.

BRIEF DESCRIPTION OF THE FIGURES

FIG. 14 is a flow chart illustrating a process for assembling an MCM in accordance with an embodiment of the present invention.

Note that like reference numerals refer to corresponding parts throughout the drawings.

DETAILED DESCRIPTION

Figure 1:
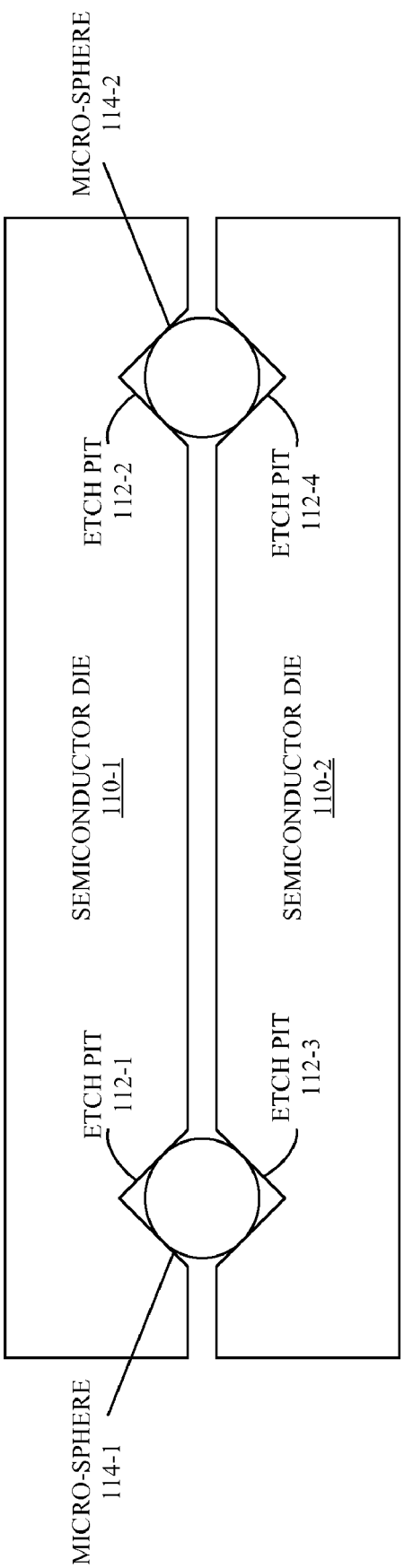
FIG. 1 is a block diagram illustrating an existing multi-chip module (MCM).

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Embodiments of a method, a semiconductor die, an MCM, and systems that include the MCM are described. Note that the MCM, which is sometimes referred to as a macro-chip, includes an array of chip modules (CMs) or single-chip modules (SCMs), and a given SCM includes at least one semiconductor die. Furthermore, the semiconductor die communicates with other semiconductor dies, SCMs, and/or devices in the MCM using proximity communication of electrical (capacitively coupled) signals and/or proximity communication of optical signals (which are, respectively, sometimes referred to as electrical proximity communication and optical proximity communication). This proximity communication occurs via proximity pads or connectors that are located on or are proximate to a surface of the semiconductor die.

Alignment of proximity connectors on neighboring or adjacent semiconductor dies or components is facilitated by features on one or more surface of the semiconductor dies. For a given semiconductor die, these features may include positive features (which protrude or extend above a surrounding region) and/or negative features (which are positioned below or recessed relative to a surrounding region). Note that the features may be defined using an additive (i.e., a material-deposition) and/or a subtractive (i.e., a material-removal) processes. In some embodiments, features on a first semiconductor die mate with or couple to features on a second semiconductor die. Furthermore, in some embodiments positive and/or negative features (such as a pyramidal-shaped etch pit or slot) are used in combination with inter-chip coupling elements (such as micro-spheres or balls). For example, the micro-spheres may be used to align components and/or to couple power or optical signals to the semiconductor die.

Fabrication of the MCM may involve the use of fluidic self-assembly of the semiconductor dies, SCMs, and/or components. In particular, one or more types of coupling elements may be positioned into features in a portion of the MCM (such as a base plate and/or a semiconductor die) using chemical-based and/or geometry-based selection. For example, the geometry-based selection may involve selection based on sizes and/or shapes of at least some of the coupling elements. Furthermore, the chemical-based selection may involve chemical bonding (such as ionic, covalent, permanent dipole, and/or van der Waals) of at least some of the coupling elements to at least some of the features. This bonding may be between compounds that include nucleic acids (such as deoxyribonucleic acid or DNA). In some embodiments, the fluidic assembly involves: gravity, mechanical agitation, an electrostatic driving force, and/or a magnetostatic driving force. Note that this technique for assembling the MCM can be implemented in a wafer-scale process, thereby facilitating: simpler assembly, rapid assembly (for example, in parallel), and/or lower cost.

Embodiments of the semiconductor die and/or the MCM may be used in a variety of applications, including: telephony, storage area networks, data centers, networks (such as local area networks), and/or computer systems (such as multi-processor computer systems). For example, the semiconductor die may be included in a switch in a backplane that is coupled to multiple processor blades, or in a switch that is coupled to different types of components (such as processors, memory, I/O devices, and/or peripheral devices). In some embodiments, the semiconductor die and/or the MCM include at least some of the functionality of a computer system.

Figure 2:
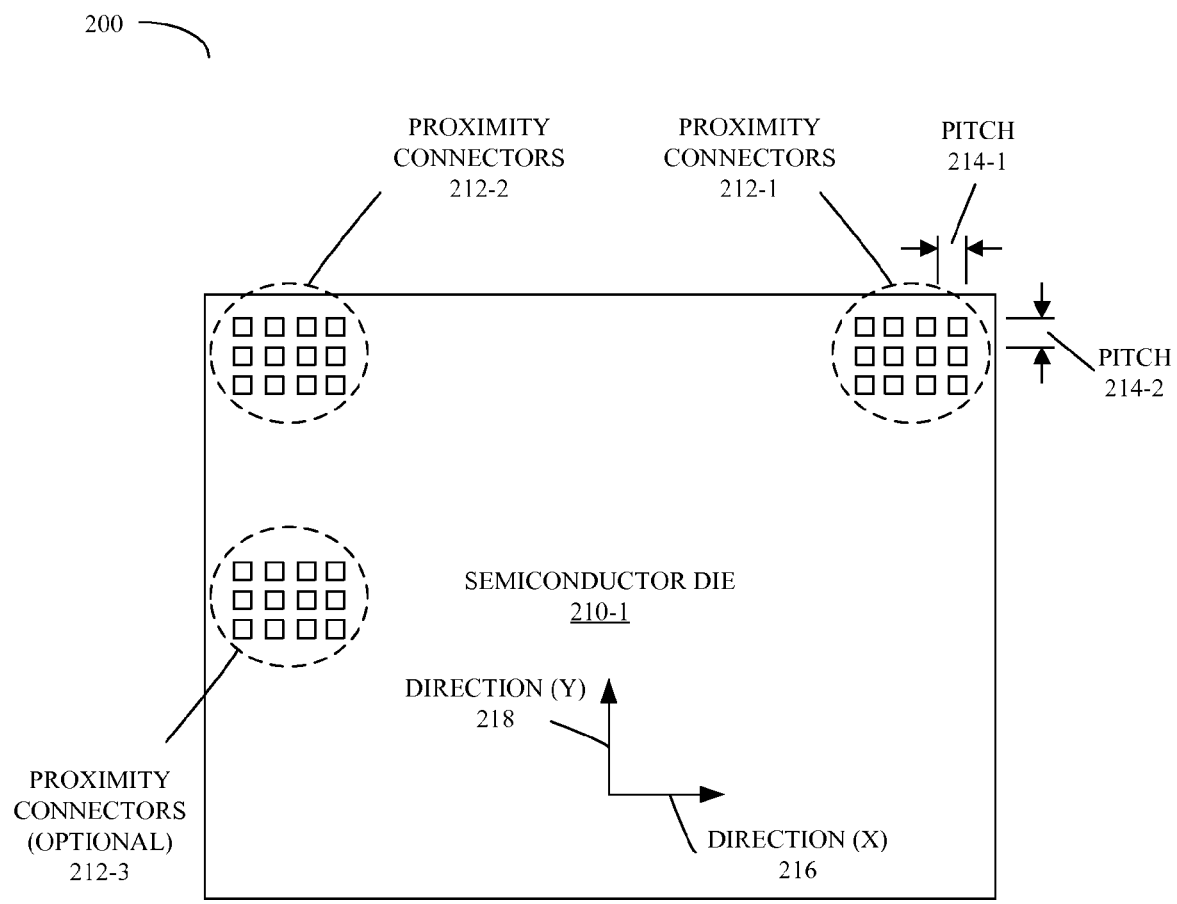
FIG. 2 is a block diagram illustrating a device that includes proximity connectors in accordance with an embodiment of the present invention.

We now describe embodiments of a semiconductor die and an MCM. FIG. 2 presents a block diagram illustrating an embodiment of a device 200 that includes proximity connectors 212 (which may be capacitive, optical, inductive, and/or conductive-based connectors). Device 200 may include at least one semiconductor die 210, where semiconductor die 210 may include integrated circuit electronics corresponding to layers deposited on a semiconductor substrate. Note that semiconductor die 210 may be packaged in an SCM and/or an MCM, where the MCM may include two or more SCMs. When packaged, for example in the SCM or the MCM, semiconductor die 210 is sometimes referred to as a "chip."

In one embodiment, the proximity connectors 212 may be located on or proximate to at least one surface of the semiconductor die 210, the SCM and/or the MCM. In other embodiments, the semiconductor die 210, the SCM and/or the MCM may be coupled to the proximity connectors 212. In an exemplary embodiment, the proximity connectors 212 are substantially located at or near one or more corners (proximity connectors 212-1 and 212-2) and/or edges (proximity connectors 212-3) of the semiconductor die 210. In other embodiments, proximity connectors 212 may be situated at one or more arbitrary locations on, or proximate to, the surface of the semiconductor die 210. Moreover, while not shown, in some embodiments solder balls or pads (such as C4 pads or bumps) may also be included on the surface of the semiconductor die 210. For example, an array of solder pads may be positioned near the center of the surface. These solder pads may be used to couple signals to the semiconductor die 210, including: power, ground (GND), control signals, and/or I/O signals.

As illustrated for the proximity connectors 212-1, there is a first pitch 214-1 between adjacent connectors or pads in a first direction (X) 216 of the surface and a second pitch 214-2 between adjacent connectors or pads in a second direction (Y) 218 of the surface. In some embodiments, the first pitch 214-1 and the second pitch 214-2 are approximately equal.

Figure 3:
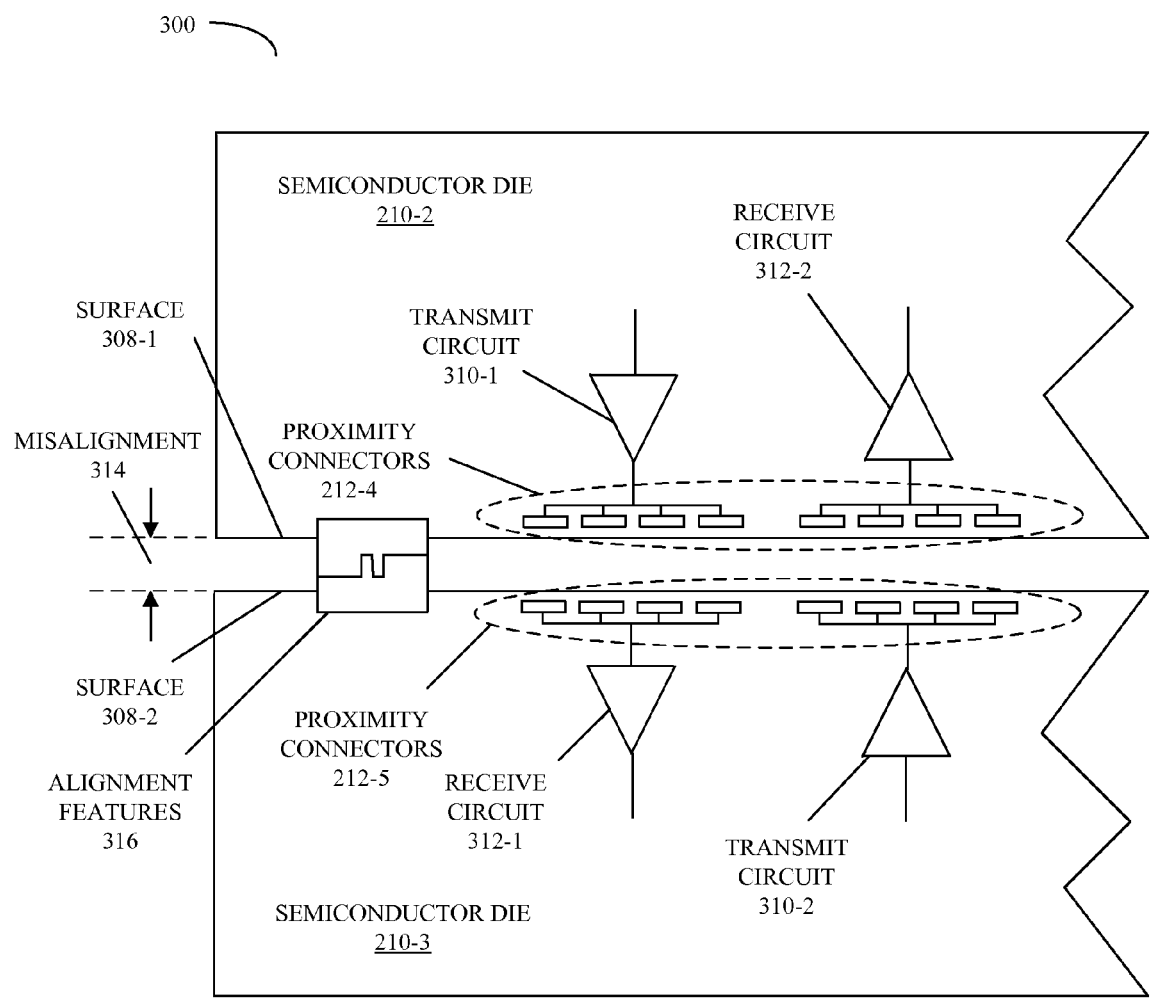
FIG. 3 is a block diagram illustrating an MCM that includes semiconductor dies that communicate using proximity communication in accordance with an embodiment of the present invention.

FIG. 3 presents a block diagram illustrating an embodiment of an MCM 300 that includes semiconductor dies 210 that communicate using capacitively coupled proximity communication (which is used as an illustration). Semiconductor dies 210 may include proximity connectors or pads 212 that are located on or proximate to at least surfaces 308 of the semiconductor dies 210. For example, the proximity connectors 212 may be situated beneath protective layers such that they are located below the surfaces 308. Moreover, subsets of the proximity connectors 212 may be coupled to transmit circuits 310 (such as transmit drivers) and receive circuits 312 (such as receivers). One of the transmit circuits 310, at least a subset of the proximity connectors 212 on the adjacent semiconductor dies 210, and one of the receive circuits 312 may constitute a communication channel. For example, the communication channel may include: transmit circuit 310-1, some of the proximity connectors 212, and receive circuit 312-1. Note that transmit circuits 310 and receive circuits 312 may utilize voltage-mode signaling (i.e., voltage-mode drivers and receivers). Furthermore, semiconductor dies 210 may also include wiring and electronics (not shown) to relay the data signals to additional electronics on the semiconductor dies 210, such as: logic, memory (for example, a packet buffer memory), I/O ports, demultiplexers, multiplexers, and/or switching elements.

In order to communicate data signals using proximity communication, transmit and receive proximity connectors 212 on adjacent semiconductor dies 210 may have, at worst, only limited misalignment, i.e., substantially accurate alignment. For densely packed proximity connectors, i.e., proximity connectors 212 having a small spacing or pitch 214 (FIG. 2) between adjacent pads, the alignment between two or more proximity connectors 212 on adjacent semiconductor dies 210 may be within a few microns in the first direction (X) 216 (FIG. 2) and/or a few microns in the second direction (Y) 218 (FIG. 2), where the first direction (X) 216 and the second direction (Y) 218 are in a first plane including at least some of the proximity connectors 212. The alignment may be within a few microns in a third direction (Z) approximately perpendicular to the first plane. Note that MCM 300 illustrates a misalignment 314 in the third direction (Z).

In some embodiments, the proximity connectors 212 may be aligned in all six degrees of freedom, including: the first direction (X) 216 (FIG. 2); the second direction (Y) 218 (FIG. 2); the third direction (z); an angle in the first plane defined by the first direction (X) 216 (FIG. 2) and the second direction (Y) 218 (FIG. 2); an angle in a second plane defined by the first direction (X) 216 (FIG. 2) and the third direction (Z); and an angle in a third plane defined by the second direction (Y) 218 (FIG. 2) and the third direction (Z). Note that X 216, Y 218, and Z are the normal orthogonal axes of 3-space. Also note that if a surface, such as the surface 308-1, of either of the adjacent semiconductor dies 210 is non-planar (for example, due to quadrapole distortion) additional alignment problems may be introduced.

In some embodiments, allowed misalignment in the first direction (X) 216 (FIG. 2), the second direction (Y) 218 (FIG. 2), and/or the third direction (z) is less than one half of the pitch 214 (FIG. 2) between adjacent pads 212. For example, misalignment in the first direction (X) 216 (FIG. 2) and/or the second direction (Y) 218 (FIG. 2) may be less than 25 µm, and the misalignment 314 in the third direction (z) may be less than 5 µm. In some embodiments, the misalignment 314 is between 1 and 10 µm.

Solutions, such as self-aligning and/or self-adjusting of the relative positions of the proximity connectors 212 on adjacent semiconductor dies 210 (and/or in a component such as a bridge chip coupling two or more semiconductor dies 210) may reduce and/or eliminate the misalignment 314 in the third direction (Z). For example, structures that have flexibility compliance (or are spring-like) may be used. In other embodiments, a feedback control loop may be used to reduce and/or eliminate the misalignment 314 in the third direction (Z). Moreover, as discussed further below, alignment of the semiconductor dies 210 (and thus, at least some of the proximity connectors 212) may be facilitated by coupling alignment features 316 located on or proximate to the surfaces 308.

Reducing or eliminating the misalignment 314, in turn, may lead to at least partial overlap of one or more proximity connectors 212 on the adjacent semiconductor dies 210 and may therefore increase a magnitude of the capacitively coupled data signals. In addition, the solutions may reduce misalignment in the first plane, i.e., the plane including at least some of the proximity connectors 212, when used in conjunction with techniques such as electronic steering (where data signals are routed to given proximity connectors 212 based on the alignment in the first plane). Consequently, these solutions may facilitate proximity communication between the semiconductor dies 210, SCMs and/or MCMs. The solutions may also reduce and/or eliminate a need for narrow tolerances, precise manufacturing, and/or precise assembly of the semiconductor dies 210, the SCM, and/or the MCM.

In the embodiments described above and below, the proximity connectors 212 on the adjacent semiconductor dies 210 utilize capacitive coupling for inter-chip communication. In other embodiments, different connectors may be overlapped on adjacent semiconductor dies 210. For example, one embodiment of the present invention uses optical proximity connectors, in which data signals are communicated optically between terminals on adjacent semiconductor dies 210. Moreover, optical waveguides, fibers, light sources (such as diodes or lasers), and/or transceivers may be integrated onto semiconductor dies 210 (or an accompanying circuit board) for intra-chip communication. Other embodiments use magnetic proximity connectors, in which data signals are communicated magnetically between terminals on closely adjacent semiconductor dies 210, or conductive connectors (such as an array of solder balls).

In some embodiments, semiconductor dies 210 are contained in an array of semiconductor dies in an MCM. For example, as illustrated in FIG. 3, semiconductor dies 210 in such an array may be positioned face-to-face, such that proximity connectors 212 on the corners (and more generally on side edges) of the semiconductor dies 210 overlap and couple signals between adjacent semiconductor dies using, for example, capacitively coupled proximity communication. In another embodiment, the semiconductor dies 210 are face up (or face down) and signals between adjacent semiconductor dies are capacitively coupled via a face-down (or face-up) bridge chip.

While the device 200 (FIG. 2) and the MCM 300 are illustrated as having a number of components in a given configuration, in other embodiments the device 200 (FIG. 2) and/or the MCM 300 may include fewer components or additional components, two or more components may be combined into a single component, and/or a position of one or more components may be changed. Furthermore, functions of the MCM 300 may be implemented in hardware and/or in software.

We now describe embodiments of alignment features, such as alignment features 316. In general, a wide variety of features, including positive features and negative features, may be used. These features may be fabricated on a wide variety of materials, including a semiconductor, a metal, a glass, sapphire, and/or silicon dioxide. In the discussion that follows silicon is used as an illustrative example. Furthermore, the features may be fabricated using additive and/or subtractive processes, including sputtering, isotropic etching, and/or anisotropic etching. In some embodiments, features are defined using photolithographic and/or direct-write techniques.

Figure 4A:
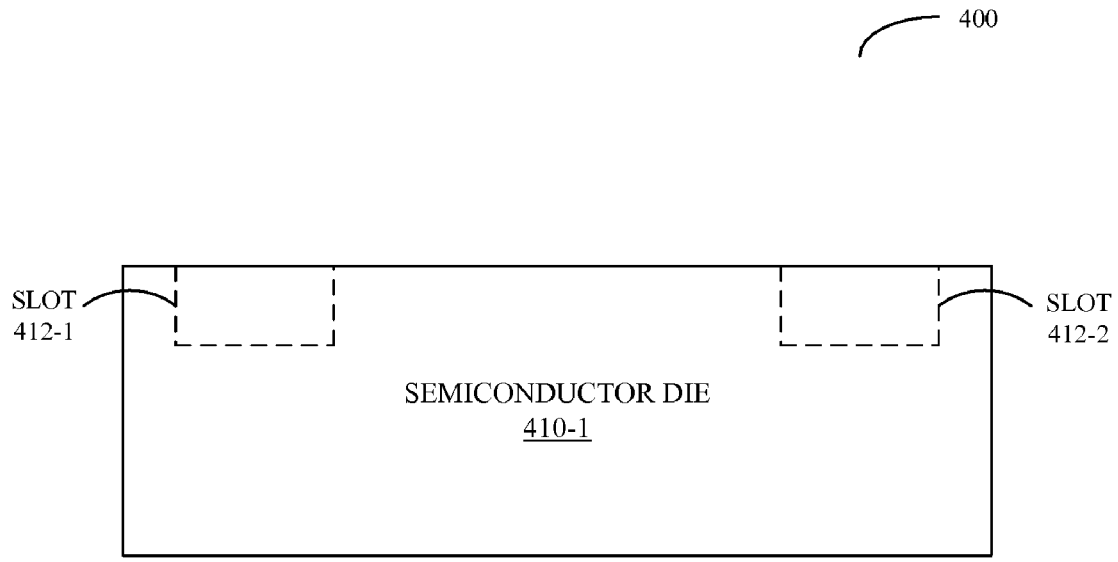
FIG. 4A is a block diagram illustrating a semiconductor die in accordance with an embodiment of the present invention.
Figure 4B:
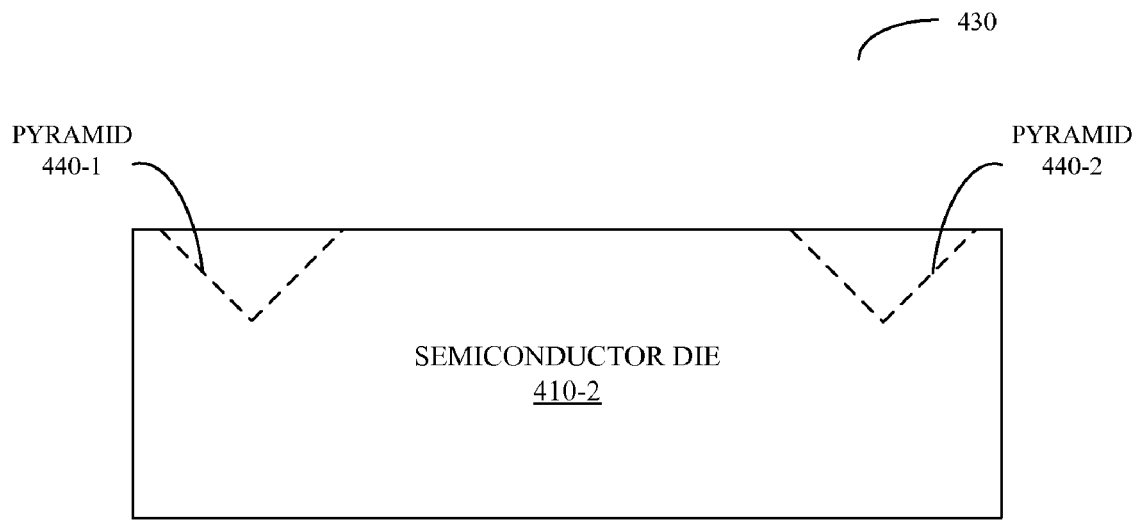
FIG. 4B is a block diagram illustrating a semiconductor die in accordance with an embodiment of the present invention.
Figure 4C:
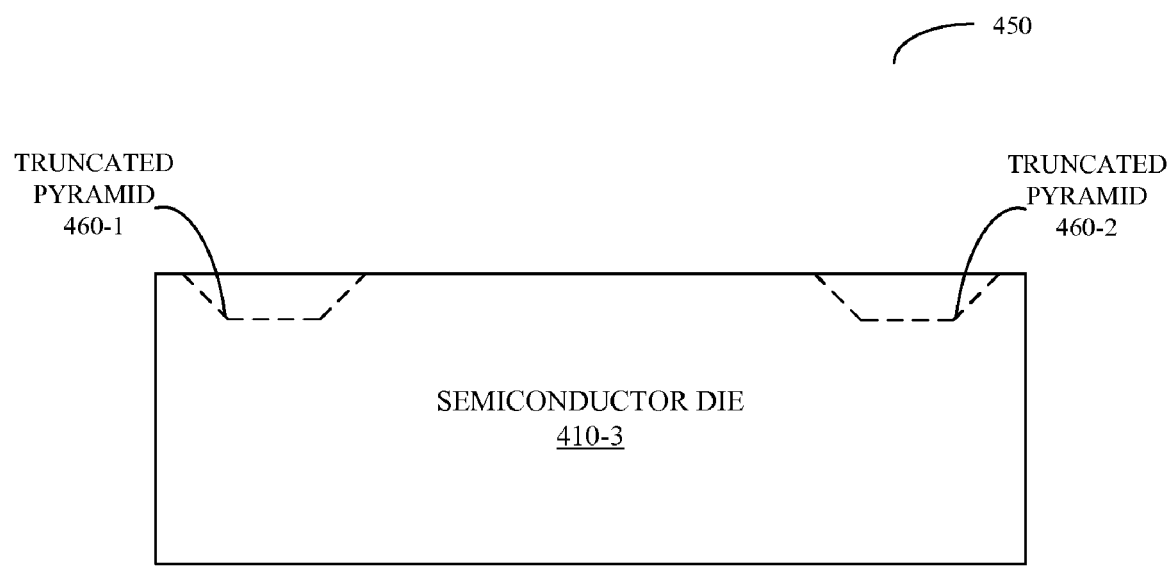
FIG. 4C is a block diagram illustrating a semiconductor die in accordance with an embodiment of the present invention.

FIGS. 4A-4C provide embodiments 400, 430, and 450 that illustrate negative features fabricated on semiconductor dies 410, including: trenches, etch pits or slots 412, pyramids 440, and/or truncated pyramids 460. As noted previously, negative features may be fabricated using a subtractive process, for example, by selective etching into a silicon substrate. Note that the etching may be self-limiting or self-terminating, such as anisotropic lithography along the <111> crystallographic direction to produce pyramids 440 (FIG. 4B). However, in some embodiments etch stops are defined, for example, using CMOS technology, to produce truncated pyramids 460 (in which the sides are along the <111> crystallographic direction and the bottom is, for example, along the <100> crystallographic direction). Alternatively, truncated pyramids 460 may be fabricated by stopping an anisotropic etch prior to completion (such as when a desired etch depth is reached).

While not shown, positive features may include: hemispheres, ridges, top-hat shapes or bumps, pyramids, and/or truncated pyramids or mesas. For example, photoresist or metal bumps may be lithographically defined and annealed to allow surface tension to draw the material into a hemisphere (which may be subsequently hard baked). In some embodiments, these features mate with or couple to corresponding negative features facilitating 'snap-fit' assembly, thereby providing and maintaining precise alignment.

Figure 5:
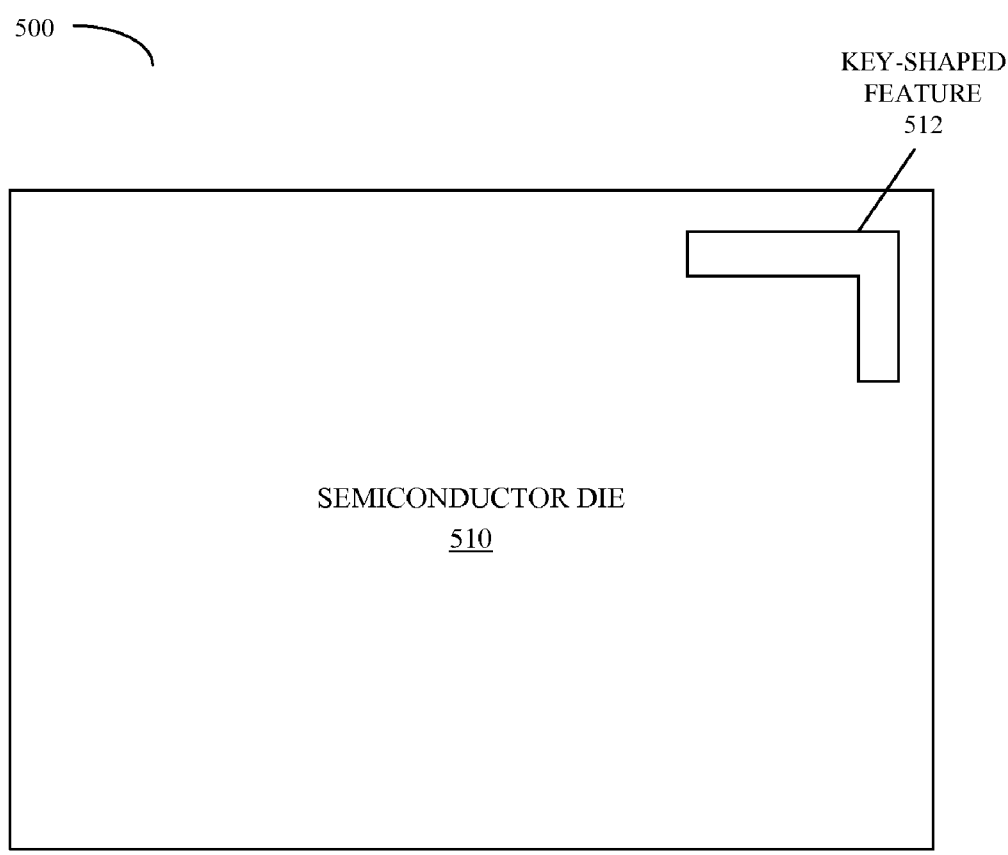
FIG. 5 is a block diagram illustrating a semiconductor die in accordance with an embodiment of the present invention.
Figure 6:
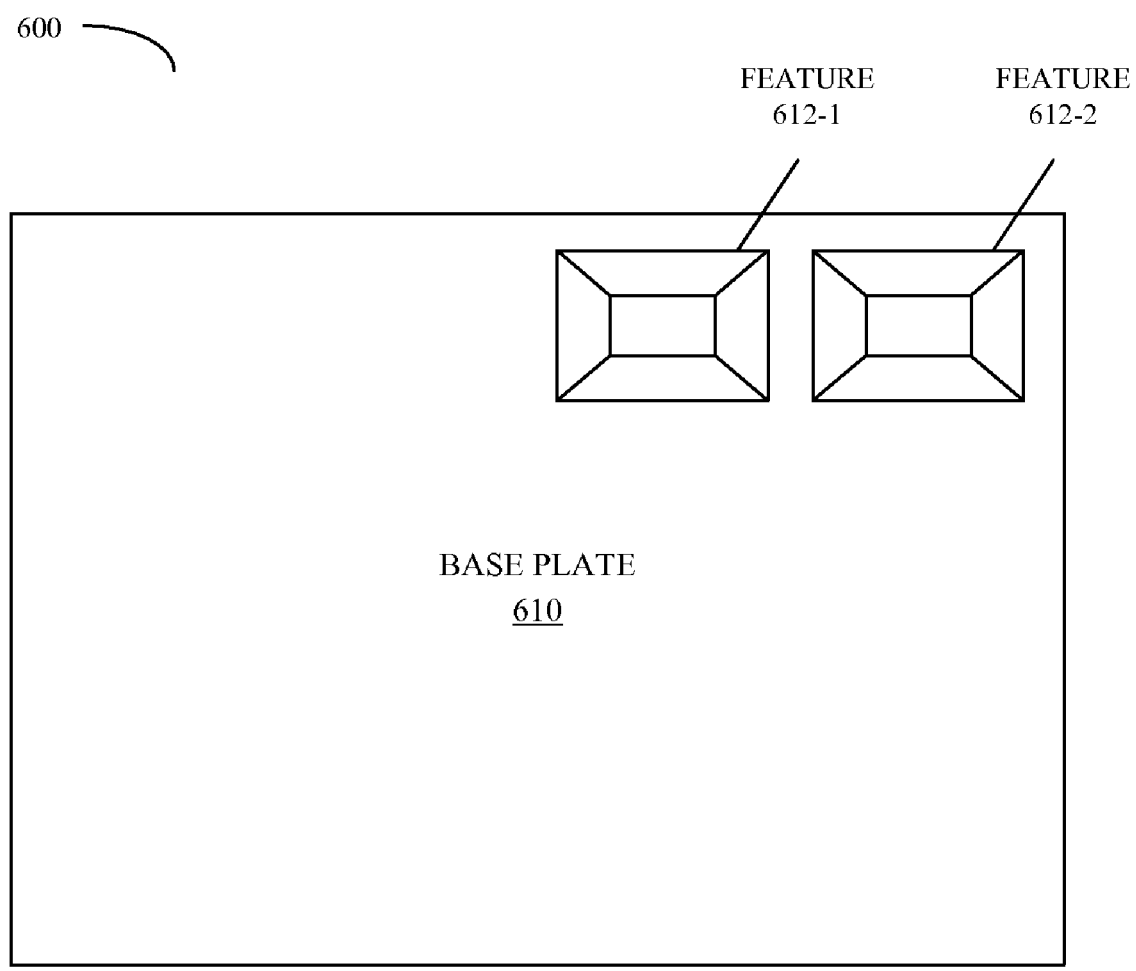
FIG. 6 is a block diagram illustrating a base plate in accordance with an embodiment of the present invention.

While embodiments 400 (FIG. 4A), 430 (FIG. 4B), and 450 (and the embodiments described below) are illustrated as having a limited number of negative features having a given configuration, other embodiments may include fewer components or additional components, two or more components may be combined into a single component, and/or a position of one or more components may be changed. For example, the negative and/or positive features may be fabricated in one or more directions. Thus, in some embodiments, positive features such as hemispheres have a hexagonal-closed-packed configuration. Furthermore, a wide variety of materials may be used for the positive and/or negative features. And in some embodiments, a given semiconductor die includes both positive and negative features, thereby breaking the symmetry and ensuring that chips can only be assembled in one physical arrangement or orientation In some embodiments, a shape of one or more positive and/or a negative features is used to determine an orientation of a semiconductor die or to limit the possible semiconductor dies that a given semiconductor die can mate with in an MCM (thereby facilitating self-assembly of an MCM). This is illustrated in FIG. 5, which provides a block diagram of an embodiment 500 of a semiconductor die 510 that includes a key-shaped feature 512. Moreover, in some embodiments an arrangement of one or more features is used to restrict orientation or mating of semiconductor dies. This is illustrated in FIG. 6, which provides a block diagram of an embodiment 600 of a base plate 610 and features 612. Note that semiconductor dies and/or components (such as bridge chips) couple to the base plate 610 during the assembly of an MCM.

In some embodiments, one or more features on the semiconductor dies include a material, such as a soft metal to provide stress relief (for example, for stress due to relative motion or due to temperature differences) between coupled semiconductor dies. Furthermore, metal layers in or on such features may also allow coupling elements (such as micro-spheres) in an MCM to couple power to one or more semiconductor dies. In these embodiments, the coupling elements are made of metal or have a metal (conductive) coating (such as gold). These coupling elements may or may not be used to align the semiconductor dies. For example, in some embodiments alignment is facilitated using positive and negative features and micro-spheres are used to couple power and/or GND to the semiconductor dies.

In some embodiments, spherical lenses or micro-spheres are used to align semiconductor dies and/or to couple optical signals between semiconductor dies. For example, micro-spheres may image light from a waveguide integrated on a first semiconductor die onto a waveguide integrated on a second semiconductor die, thereby facilitating optical communication between these semiconductor dies. In another embodiment, spherical resonators doped with optional optical gain materials are used to precisely align the first semiconductor die to the second semiconductor die. These spherical resonators may facilitate azimuthal coupling between the first waveguide integrated on the first semiconductor die and the second waveguide integrated on the second semiconductor die. Moreover, the spherical resonators may facilitate optical filtering and optical gain during optical communication between these semiconductor dies.

Thus, the micro-spheres may include materials such as: sapphire, glass, silicon dioxide, conductive materials (for example, a metal), and/or non-conductive materials.

In the discussion that follows, coupling elements (such as micro-spheres) are used in conjunction with negative features (as an example) to align semiconductor dies in an MCM. As noted previously, it is often difficult to place the coupling elements into the features during a wafer-scale process. In principle, fluidic self-assembly may be used to sort and position objects, such as coupling elements, into the features during a wafer-scale process. For example, assembly may be based on the geometry (i.e., the size, shape, and/or orientation) of the coupling elements and/or the features. However, while such geometry-based techniques offer high directional selectivity (as illustrated in FIGS. 5 and 6), the site selectivity (i.e., the ability to ensure that a given type of coupling element is placed into or coupled to a given type of feature) may be limited. This is a challenge, especially in heterogeneous environments that include coupling elements and/or features that have a range of: sizes, shapes, and/or orientations.

In contrast, chemical-based coatings (for example, adhesion promoters such as surfactants) on the coupling elements and/or in the features can offer high site selectivity. While arbitrary chemical compounds may be used to implement chemical-based fluidic self-assembly, in the discussion that follows chemicals containing one or more nucleic acids or nucleotides (such as DNA) are used as an illustrative example.

Nucleotides are composed of a phosphodiester covalently bound to a nucleoside or a derivative of a deoxyribose sugar and either a purine or pyrimidine nucleobase. Nucleobases include purines, such as: adenine (A), guanine (G), and the pyrimidines, i.e., thymine (T) and cytosine (C). These nucleotides can be bound to each other to form a linear chain (or strand) through their phosphodiester bonds that must terminate or begin at either the 5' or 3' carbon of the adjacent nucleotide (i.e., the $5^{th}$ or $3^{rd}$ carbon in the deoxyribose sugar). This arrangement imparts a direction to the chain because of an exposed 3' or 5' site at opposite ends. Note that each end is capped with either an —OH or a phosphate group.

A sequence of nucleotides (also called bases) in the strand can be arbitrary and by convention is written as a sequence from the 5' end to the 3' end (for example, 5'-AGGTC-3'). This represents a so-called single-stranded DNA molecule. Furthermore, the geometry of the phosphodiester bond and the shape of the nucleosides create the potential for single strands of DNA to wrap around one another in anti-parallel directions. Thus, any two strands are geometrically compatible if oriented in an anti-parallel fashion and can form a helical structure, or a double-stranded DNA molecule.

DNA-assisted self-assembly is a technique in which artificially synthesized single-stranded DNA self-assemble into DNA molecules. These DNA molecules have ends that display strong affinity for and preferentially match to the corresponding ends of certain other DNA molecules, thereby promoting the matching or mating of the molecules into a lattice. Note that the self-assembly of large two-dimensional lattices consisting of thousands of molecules has been demonstrated, and even three-dimensional lattices are expected. This spontaneous self-ordering of sub-structures into super-structures can be a powerful tool for self-assembly of complex systems.

An important quality of DNA that makes suitable for self-assembly is its ability to hybridize with its complement with very high selectivity. Furthermore, the ability to convert double-stranded DNA into a highly conductive ohmic contact during a metallization process makes the use of DNA assembly at micro- and nano-length scales useful for establishing circuit connections. Note that the hybridization or self-assembly is guided by the thermodynamic properties of DNA that give it the ability to form unique pairs among complementary strands. Also note that these techniques may be used to create self-assembling structures at length scales between 10 nm (the molecular scale) and a few centimeters with strong site selectivity. For example, simple experiments have shown that conductive gold balls can be hybridized using DNA to select specific locations on an array.

Unfortunately, there are some problems associated with DNA-assisted self-assembly. In particular, self-assembly of nano-scale components may be hindered by surface-area effects that limit the yield of the process. In other words, there may be competing nonspecific interactions that need to be reduced in order to enhance specific (for example, DNA-binding) assembly events. In addition, the assembly of DNA molecules accelerates inversely with temperature. Consequently, DNA-assisted self-assembly is an inherently stochastic process with potentially uncertain result and the termination of such a process is not guaranteed.

These problems (and those discussed previously) may be addressed by combining geometry-based selection and chemical-based selection during fluidic self-assembly to provide high site selection. In some embodiments, a highly selective, stochastic assembly process (such as DNA-assisted self-assembly) includes a strong homogeneous forcing function. This assembly process is rapid and parallel (thus, reducing assembly time and cost), and facilitates selective placement of alignment microstructures (i.e., coupling elements) into corresponding features (such as etch pits) in the host semiconductor dies and/or other components in an MCM (such as the base plate or bridge chips). In addition, the combination of these techniques helps terminate the assembly process with high yield and is well suited for heterogeneous assembly.

Figure 7:
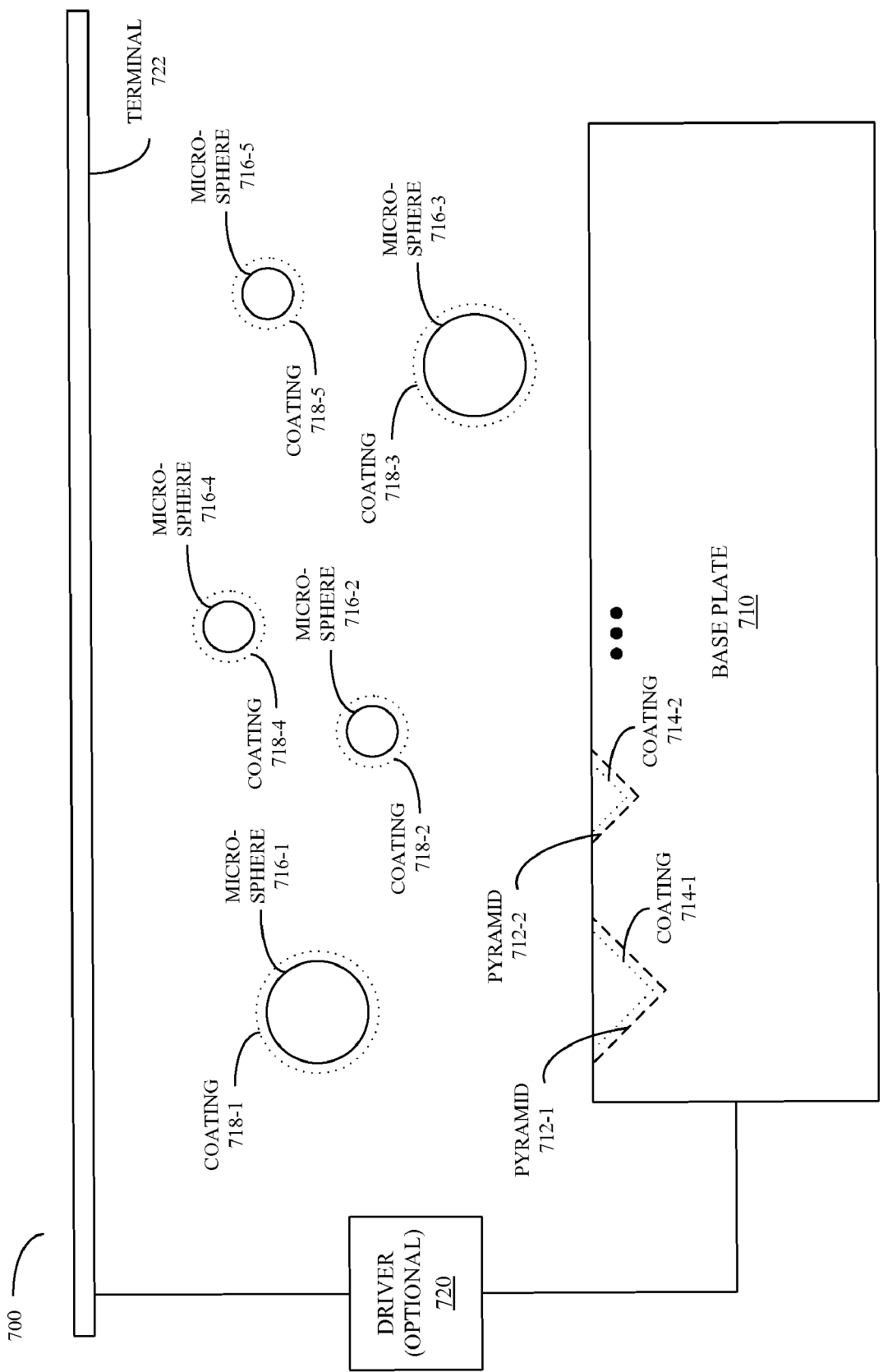
FIG. 7 is a block diagram illustrating a technique for assembling an MCM in accordance with an embodiment of the present invention.

FIG. 7 presents a block diagram illustrating an embodiment 700 of a technique for assembling an MCM in which micro-spheres 716 are placed into corresponding pyramidal-shaped features 712 in a base plate 710. In this embodiment, the pyramidal-shaped features 712 include chemical coatings 714 and the micro-spheres 716 include chemical coatings 718. These coatings provide chemical-based selectivity. Furthermore, the geometry of the micro-spheres 716 and/or the pyramidal-shaped features 712 provides geometry-based selectivity, as illustrated by the different sizes of the micro-spheres 716 and the pyramidal-shaped features 712 (thus, micro-sphere 716-1 may be positioned into pyramidal-shaped features 712-1 and micro-sphere 716-2 may be positioned into pyramidal-shaped features 712-2). Using this assembly technique, alignment micro-structures or coupling elements (such as the micro-spheres 716) can be self-assembled into the appropriate pyramidal-shaped features 712 in the base plate 710 (such as a silicon chip) with high accuracy and yield. Note that these coupling elements may have differing: purposes, materials, sizes, and/or shapes.

In an exemplary embodiment, coatings 714 and/or 718 include one or more nucleic acids or nucleotides, i.e., DNA-assisted fluidic self-assembly is used to position the micro-spheres 716 into the pyramidal-shaped features 712. This may be accomplished by coating a set of micro-structures (such as at least some of the micro-spheres 716) with a first type of artificially produced DNA strands (i.e., at least some of the coatings 718). Then, a photolithographic mask may be used to place a second set of DNA strands (i.e., at least some of the coatings 714), which are complementary to the first type of DNA strands and have a high affinity for the first type of DNA strands, into a corresponding set of target features (i.e., at least some of the pyramidal-shaped features 712) in the base plate 710 where the set of micro-structures are to be assembled.

In some embodiments, these operations are repeated and multiple types of pairs of coatings are used. For example, a second set of micro-structures are coated with a third type of artificially produced DNA strands and another photolithographic mask may be used to place a fourth type of artificially produced DNA strands into a corresponding set of target features. Note that the third and fourth types of artificially produced DNA strands have a high affinity for each other and may also have a strong repulsion with the first and second types of artificially produced DNA strands. These operations may be repeated until all of the micro-spheres 716 and all of the pyramidal-shaped features 712 include coatings 714 and 718.

In some embodiments of the assembly process, fluids containing different micro-spheres 716 (i.e., having different sizes, shapes, and/or coatings 718) may be applied sequentially. For example, a first fluid (such as a solvent) containing larger micro-spheres, micro-spheres having a given shape (such as a cylinder or a sphere), and/or micro-spheres having a first type of coating may be applied to the base plate 710. This fluid may remain in contact with the base plate 710 for sufficient time (for example, a few minutes) to allow these micro-spheres to couple to corresponding pyramidal-shaped features 712. Then, the fluid may be removed and any residual or excess micro-spheres, which are on the surface of the base plate 710 but which are not in or chemically bonded to appropriate pyramidal-shaped features 712, may be removed. For example, the fluid may be removed by evaporation and residual micro-spheres may be removed using a rise or wash operation. Next, these operations may be repeated with one or more additional fluids containing progressively smaller micro-spheres, micro-spheres having another shape, and/or micro-spheres having different types of coatings. Alternatively, in some embodiments the multiple types of micro-spheres are applied to the base plate 710 in parallel, i.e., using a single fluid.

Note that various metrics may be used to determine how long a given fluid needs to be in contact with the base plate 710. For example, contact may be maintained until a percentage or all of the pyramidal-shaped features 712 are filled with micro-spheres 716. In some embodiments, a fill factor is determined by measuring how many of the pyramidal-shaped features 712 appear as light or dark in an image (or, more generally, based on a measured reflectivity).

In some embodiments, at least some of the micro-spheres 716 are dissolved after assembly of the MCM is completed. For example, some of the micro-spheres 716 may include polystyrene, which may be dissolved using acetone or another organic solvent. Moreover, in some embodiments extra micro-spheres are recovered or recycled from one or more fluids using a filtering operation.

In some embodiments, a driving force is used to accelerate the fluidic assembly. For example, an optional driver 720 may apply a DC or time varying field between a terminal 722 and the base plate 710. In some embodiments, the driving force includes: mechanical agitation (such as ultrasound), an electric field, a magnetic field, and/or an electromagnetic field. Moreover, in some embodiments gravity is used to separate bound micro-spheres from excess micro-spheres, which may simply roll of the surface of a tilted base plate 710. Note that the use of a driving force can reduce a sensitivity of the fluidic self-assembly process to temperature variations and/or surface tension.

In an exemplary embodiment, the driving force is an electric field, in an electrochemical transport process referred to as micro-electrophoresis. However, this technique is only applicable to non-conductive, homogeneous coupling elements (such as glass micro-spheres) and movement is only restricted along specific directions (i.e., along the direction of the applied electric field).

Using one or more of these embodiments, an MCM may be assembled with high accuracy and high site selectivity. In addition, by combining geometry-based selectivity with chemical-based selectivity, a stochastic process (such as DNA-based fluidic self-assembly) may be converted into one with a known, high yield.

Figure 8:
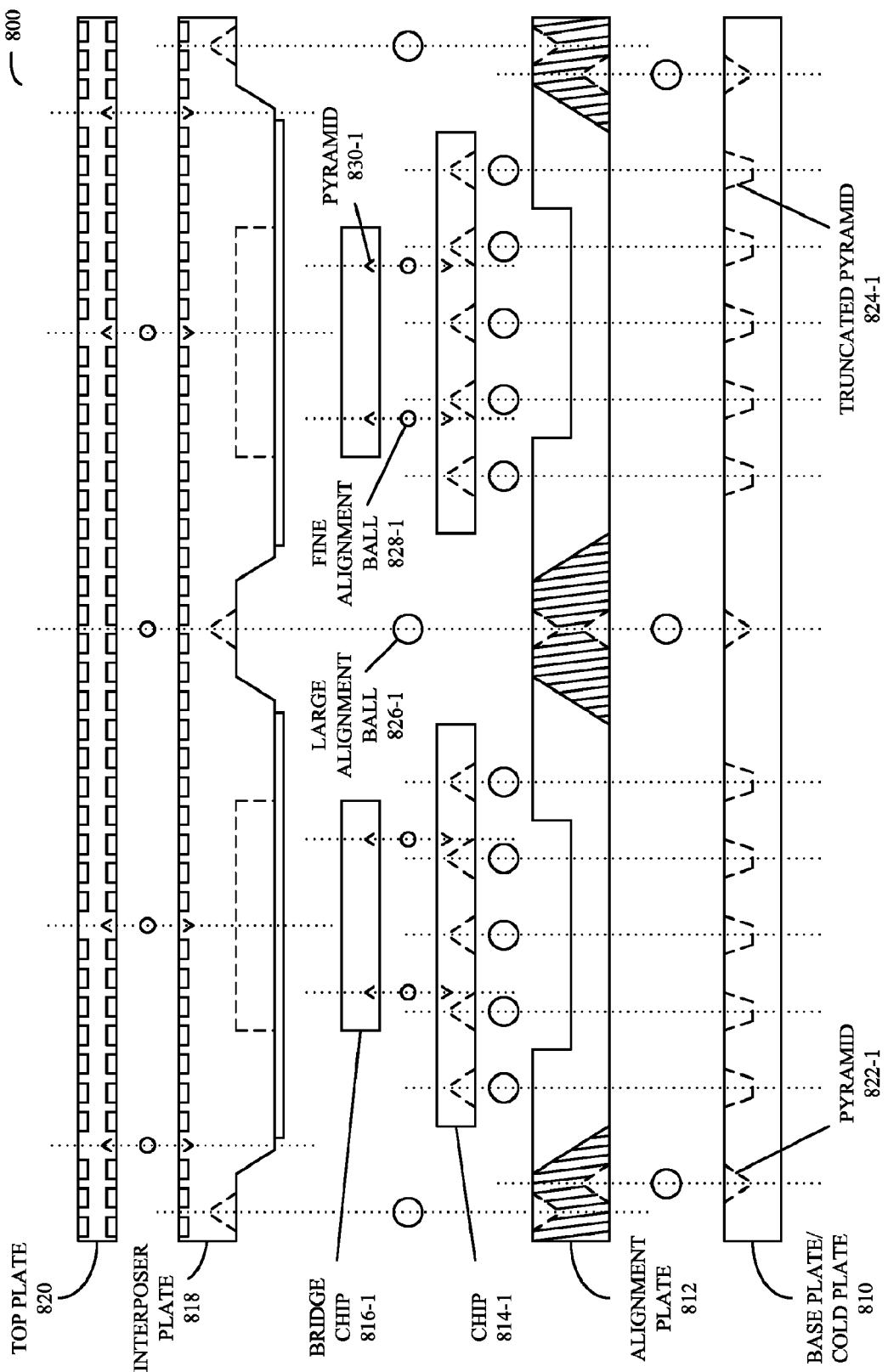
FIG. 8 is a block diagram illustrating an MCM in accordance with an embodiment of the present invention.

We now describe embodiments of an MCM. FIG. 8 presents a block diagram illustrating an MCM 800. This MCM (which is sometimes referred to as a RockSolid package) offers improved modularity and functionality, and is highly manufacturable. In particular, MCM 800 is a multi-layer assembly that includes: a base plate/cold plate 810, an alignment plate 812, one or more chips 814 (such as the semiconductor die 210 in FIG. 2), one or more bridge chips 816 to couple proximity connectors on adjacent chips 814, an interposer plate 818, and a top plate 820.

These layers may be coupled together using negative features or alignment pits (such as pyramidal-shaped features 822 and/or truncated pyramidal-shaped features 824 on the front and/or back surfaces of components) in conjunction with coupling elements (such as large micro-spheres or balls 826 and/or fine micro-spheres or balls 828). Note that the alignment pits in the chips 814 mate with corresponding alignment pits in the base plate/cold plate 810. Thus, the base plate/cold plate 810 may position the chips 814 with appropriate horizontal and vertical alignment. In addition, the base plate/cold plate 810 may remove heat from the chips 814. Similarly, the interposer plate 818 and the top plate 820 may provide moderately precise and compliant horizontal and vertical alignment, as well as power, ground, control signals, and/or I/O signals to the chips 814 and/or the bridge chips 816.

In an exemplary embodiment, the large micro-spheres 826 have a diameter of 300 μm±1 μm and the fine micro-spheres 828 have a diameter of 100 μm±0.5 μm. Moreover, the pyramidal-shaped features 822 and the truncated pyramidal-shaped features 824 may facilitate alignment of the components with a tolerance of 5 μm, while the pyramidal-shaped features 830 may facilitate alignment of the components with a tolerance of 1 μm. Thus, precise alignment may occur between the bridge chips 816 and the chips 814, with the precision limited by the lithographic accuracy of the alignment pits and the diameter of the fine micro-spheres 828 (and independent of sawing errors that occur when dicing components in the MCM 800).

Note that the MCM 800 facilitates alignment using a hierarchical approach (with structures that achieve coarse alignment, and other structures that achieve fine alignment). This hierarchical approach: reduces the cost of the components; allows for easier assembly; and increases the robustness of the alignment to perturbations, such as vibration, thermal stress, and mechanical shock. Furthermore, because the critical dimensions only have a few microns of accuracy, manufacturing of some components may be performed with relaxed particulate counts and/or using low-cost production techniques, such as silk-screening.

While the MCM 800 (and the embodiments described below) is illustrated as having a number of components in a given configuration, in other embodiments MCM 800 may include fewer components or additional components, two or more components may be combined into a single component, and/or a position of one or more components may be changed. For example, in some embodiments the bridge chips 816 are replaced with additional chips. Proximity connectors on these additional chips are positioned face-to-face with the proximity connectors on the chips 814 in a symmetric (alternating) configuration of chips. However, in some embodiments some of the chips 814 are face-to-face while other chips 814 are face up and are coupled to adjacent chips using face-down bridge chips 816.

Figure 9A:
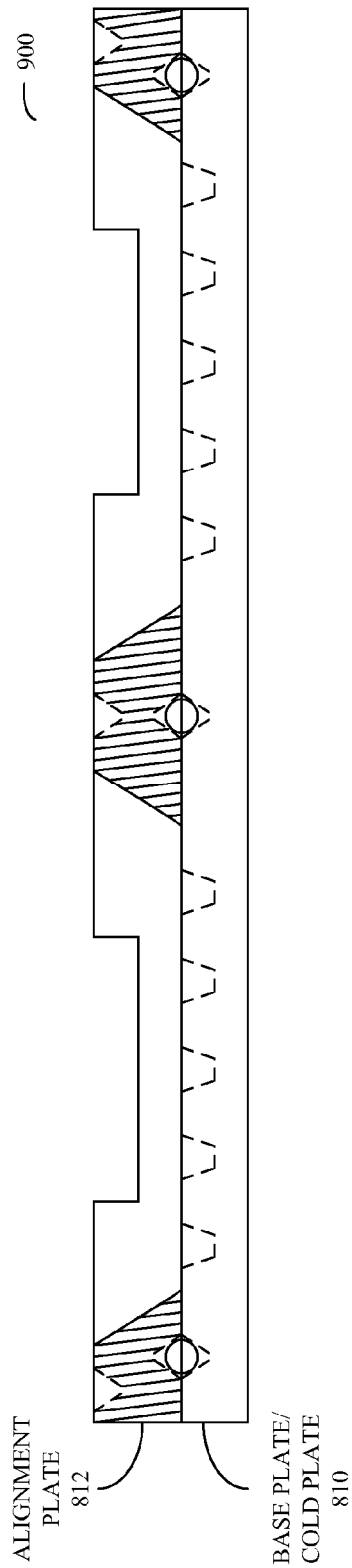
FIG. 9A is a block diagram illustrating a portion of an MCM in accordance with an embodiment of the present invention.
Figure 9B:
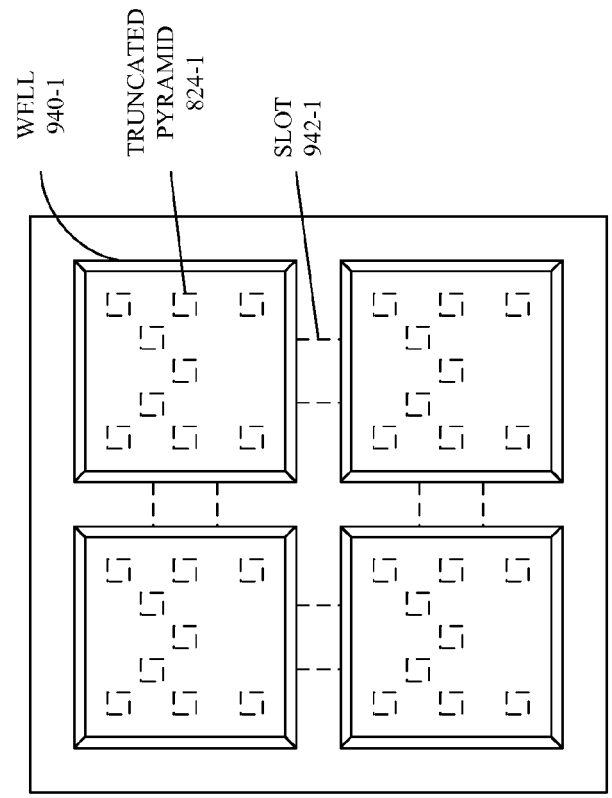
FIG. 9B is a block diagram illustrating a portion of an MCM in accordance with an embodiment of the present invention.

FIGS. 9A and 9B presents block diagrams 900 and 930 illustrating a side view and a top view, respectively, of a portion of the MCM 800 in FIG. 8 (including base plate/cold plate 810 and alignment plate 812). In this MCM, the base plate/cold plate 810 may transport heat, generated in the chips 814 (FIG. 8) and/or the bridge chips 816 (FIG. 8), away from the MCM. For example, the base plate/cold plate 810 may include a layer made from silicon wafer (the base plate with the alignment pits) positioned above a lithographically defined damascene copper layer (the cold plate). This damascene copper layer may include micro-channels corresponding to each chip location, thereby facilitating cooling of the chips 814 (FIG. 8) using a heat-transfer technique, such as liquid and/or air cooling.

Note that the thermal conductivity between chips 814 (FIG. 8) and the base plate/cold plate 810 may be increased using a variety of thermal-interface materials (TIMs), including: alloy solder, diamond (such as diamond films produced using chemical vapor deposition), a phase-change material, a thermal oil, a thermal grease, and/or a thermal epoxy. In some embodiments, a TIM is impregnated with a laterally oriented nano-particle filler that enhances the thermal conductivity between a heat source (the chips 814 in FIG. 8) and a heat sink (the base plate/cold plate 810). Moreover, in some embodiments one or more of these approaches may be implemented during a wafer-level process to achieve a low-unit cost.

Alignment plate 812 may be used to provide coarse or sloppy alignment in the horizontal (X-Y) plane for the chips 814 (FIG. 8) (using negative features, such as wells 940) and the bridge chips 816 (using negative features, such as open-ended slots 942). Moreover, as noted previously the base plate/cold plate 810 may align and define an orientation of an array of chips 814 (FIG. 8) using a pattern of truncated pyramids 824. Also note that the chips 814 (FIG. 8) aligned on the base plate/cold plate 810 will share global positioning with micron-level alignment accuracy if the same lithographic process is used to define the alignment pits on the base plate/cold plate 810 and the chips 814 (FIG. 8).

Figure 10A:
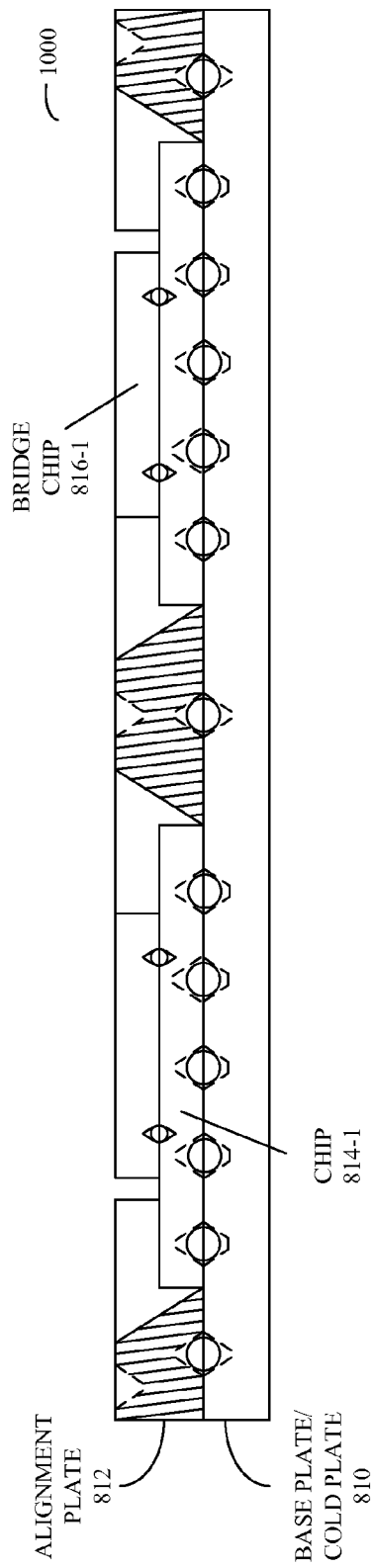
FIG. 10A is a block diagram illustrating a portion of an MCM in accordance with an embodiment of the present invention.
Figure 10B:
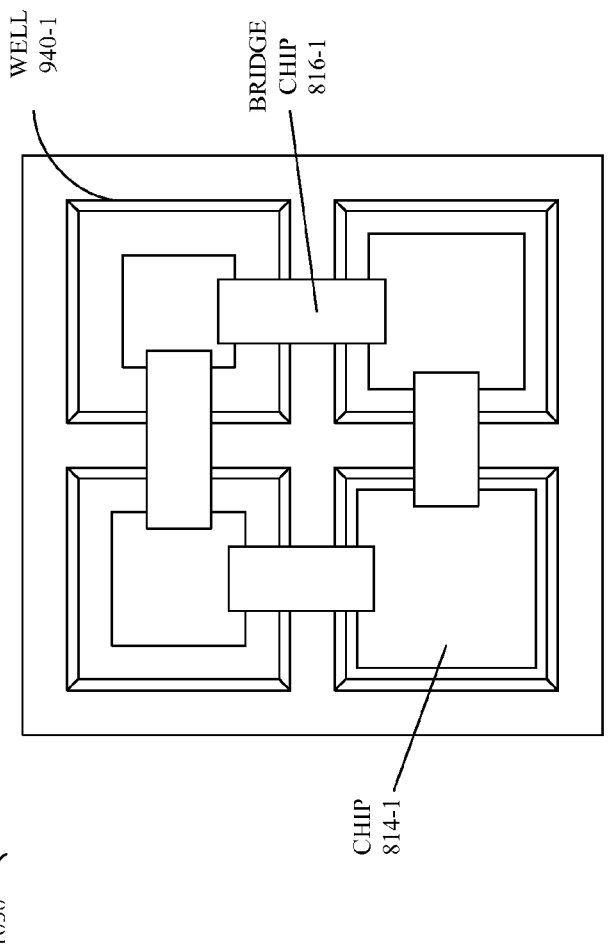
FIG. 10B is a block diagram illustrating a portion of an MCM in accordance with an embodiment of the present invention.

FIGS. 10A and 10B presents block diagrams 1000 and 1030 illustrating a side view and a top view, respectively, of a portion of the MCM 800 in FIG. 8 (including base plate/cold plate 810, alignment plate 812, chips 814, and bridge chips 816). Block diagram 1030 illustrates the ability of the base-plate/cold plate 810 to accommodate one or more chip sizes and/or one or more orientations (using one or more bridge chip sizes and/or one or more well sizes) depending on the arrangement of the micro-spheres in the alignment pits. For example, micro-spheres may be selectively coupled to the alignment pits using: a pick-and-place process, the previously described fluidic self-assembly process (including gravity, chemical-based, and/or geometry-based selection), and/or micro-electrophoresis.

Note that the minimum number of alignment pits (or, more generally, negative features) to position and orient a given chip (and to exclude chips having different micro-sphere/alignment-pit configurations) is two. Thus, in some embodiments the base plate/cold plate 810 includes alignment pits and/or patterns of alignment pits that can accommodate a variety of chips 814 (a so-called 'universal' base plate). However, in some embodiments the base plate/cold plate 810 includes alignment pits and/or a pattern of alignment pits that corresponding to a given type of chip.

In some embodiments chips 814 are thinned and have alignment pits on the front and back surfaces. Similarly, the bridge chips 816 may also be thinned for improved flexibility, thereby accommodating thickness variations in the chips 814. In an exemplary embodiment, the chips 814 have a thickness of 200 µm and the bridge chips 816 have a thickness of 50-100 µm.

FIG. 10B illustrates a fully populated MCM in which all of the wells 940 include chips 814 and all of the chips 814 are coupled to bridge chips 816. Note that assembly of this MCM may occur in a series of operations. For example, micro-spheres may be positioned into alignment pits in one or more wells 940 during a given operation. Then, the chips 814 may be positioned into the appropriate wells 940 during one or more additional operations. After the chips 814 are positioned, micro-spheres may be position into alignment pits on a top surface of one or more chips 814 and/or in alignment pits in one or more of the slots 942 (FIG. 9B) during one or more subsequent operations. Next, the bridge chips 816 may be positioned onto appropriate chips 814 during one or more final operations. At the end of the assembly process, the chips 814 and the bridge chips 816 will be positioned with sufficient horizontal and vertical accuracy to enable inter-chip proximity communication.

In some embodiments the bottom surfaces of the chips 814 do not include alignment pits, thus providing the chips 814 more lateral freedom (which is sometimes referred to as a floating-chip configuration). In this case, local alignment is accomplished using the bridge chips 816. For example, alignment pits and micro-spheres on the top surfaces of the chips 814 may align these chips relative to the bridge chips 816, and the bridge chips 816 may be aligned relative to the base plate/cold plate 810 using alignment pits and micro-spheres in the slots 942 (FIG. 9B).

Note that during assembly, adjacent chips 814 may be repositioned as a given bridge chip is inserted to lock the array into global alignment. In theory, the alignment can approach one micron (or less). In practice photolithographic variations may accumulate thereby limiting the alignment to slightly greater than one micron. However, this approach can tolerate large variations in the positions of the alignment pits while maintaining the desired alignment. In particular, the positions of the alignment pits may vary by as much as half of the diameter of the micro-spheres and the global alignment of the chips 814 may still achieve the theoretical limit. This relaxed assembly tolerance lowers the cost of the components, and thus, of the MCM.

In some embodiments, the base plate/cold plate 810 includes wells 940 having different site depths to facilitate positioning adjacent chips 814 face up and face down. This arrangement can eliminate some or all of the bridge chips 816.

Figure 11:
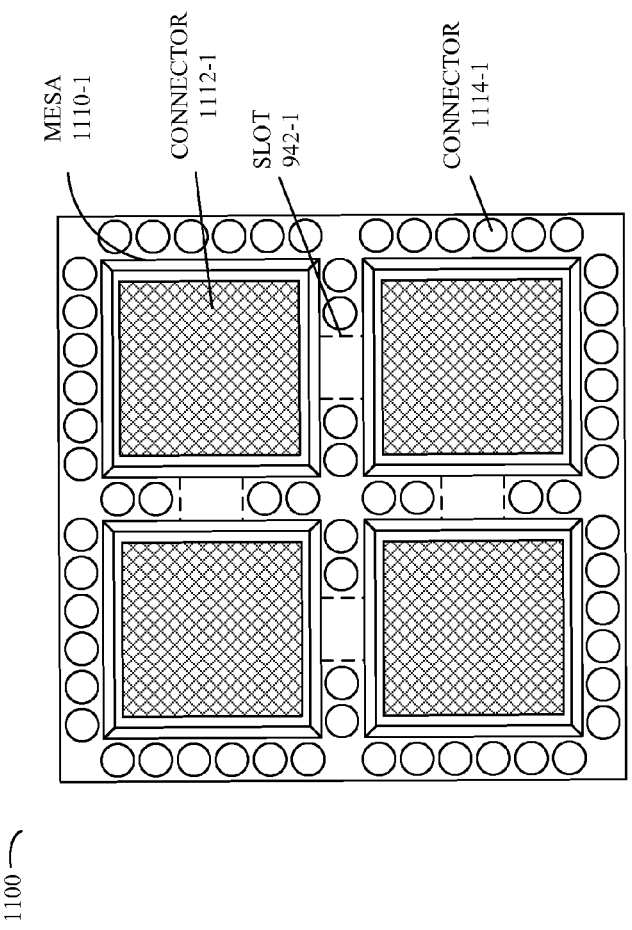
FIG. 11 is a block diagram illustrating an interposer plate in an MCM in accordance with an embodiment of the present invention.

FIG. 11 presents a block diagram illustrating a bottom view of the interposer plate 1100 in the MCM 800 (FIG. 8). This interposer plate may be fabricated using silicon, and may include positive features, such as protruding truncated pyramidal-shaped features or mesas 1110 (which mate with the wells 940 in FIG. 9B), which transmit force and thereby coarsely align the chips 814 (FIG. 8). In addition, the interposer plate 1110 may provide power, GND, control signals, and/or I/O signals (henceforth collectively referred to as signals) to the chips 814 (FIG. 8) and/or the bridge chips 816 (FIG. 8). For example, connectors 1112 may electrically couple the signals to: solder balls, solder pads (such as an array of C4 pads near the center of the chips 814), and/or vias on the chips 814 (FIG. 8). Thus, in some embodiments connectors 1112 provide power to one side of the chips 814 (FIG. 8) and the resulting heat that is generated is conducted from the other side of the chips 814 (FIG. 8) to the base plate/cold plate 810 (FIG. 8).

Note that in some embodiments a given via is implemented using a metal-lined or metal-filled alignment pit, which goes all the way through a component (such as a given chip and/or a given bridge chip), in conjunction with a metal or a metal-coated micro-sphere. In some embodiments, vias are fabricated using laser or mechanical drilling followed by metallization.

Furthermore, additional connectors or traces (not shown) in the interposer plate 1100, which are positioned over the slots 942, may electrically couple the signals to: solder balls, solder pads, and/or vias on the bridge chips 816 (FIG. 8). Alternatively, the signals may be coupled to the bridge chips 816 (FIG. 8) from the chips 814 (FIG. 8) using metal or metal-coated micro-spheres.

In some embodiments, the signals may be coupled from the top surface of the interposer plate 1100 to the bottom surface (shown in FIG. 11) using connectors 1114. These connectors may include vias that include a hemispherical, metal-coated protrusion (such as one made of silicon gel), which may be fabricated using injection molding or epoxy dispensing techniques. These protrusions may transmit force and provide compliance in the vertical direction in the MCM 800 (FIG. 8). In some embodiments, additional protrusions (not shown) over the bridge chips 816 (FIG. 8) (i.e., in the slots 942) also transmit force and provide compliance in the vertical direction. Furthermore, connectors 1112 may be coupled to connectors 1114, for example, using traces (not shown) along with solder or gold paste.

In some embodiments, connectors 1112 include a flexible, interdigited array of springs that are configured to electrically couple to 80-µm wide C4 pads on the chips 814 (FIG. 8). For example, each of the connectors 1112 may include 176,000 springs that are 6 µm wide and which have a pitch of 10 µm. These springs may couple to 8500 C4 pads on a given chip, thereby providing considerable redundancy (and thus, reliability). Furthermore, the springs may be coated with: gold, solder, and/or solder paste. As discussed further below, after testing (and any reworking) of the MCM 800 (FIG. 8) is completed, this solder may be reflowed to make connections more reliable and/or permanent. However, note that to maintain the compliance of the MCM 800 (FIG. 8), solder may not be used over the bridge chips 816 (FIG. 8).

In an exemplary embodiment, the interposer plate 1100 has a thickness of 600 μm. Moreover, the power to a given chip may be 50-100 W, and the power to a given bridge chip may be 1 W.

Figure 12:
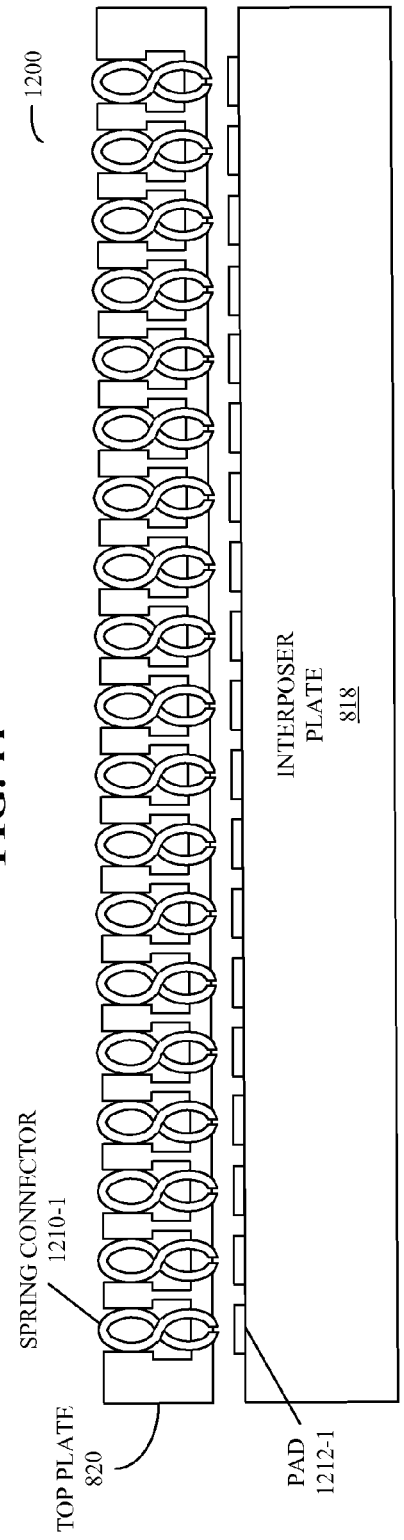
FIG. 12 is a block diagram illustrating a portion of an MCM in accordance with an embodiment of the present invention.

FIG. 12 presents a block diagram 1200 illustrating a side view of a portion of the MCM 800 in FIG. 8 (including interposer plate 818 and top plate 820). Top plate 820 may electrically couple the signals to pads 1212 on the top surface of the interposer plate 818 using springs 1210. Note that these springs expand when compressed, and the edges of the springs 1210 may remove oxide from the surface of the pads 1212. In an exemplary embodiment, the top plate 820 is made of plastic or ceramic, and the springs 1210 are made of a beryllium-gold alloy.

As noted previously, vias in the interposer plate 818 may couple the signals from the pads 1212 to the bottom surface of the interposer plate (which is illustrated in FIG. 11). Note that the pads 1212 may be larger than corresponding pads or connectors on the bottom surface of the interposer plate 818. Thus, the interposer plate 818 may perform a registration process in which signals are coupled from a region of coarse alignment in the MCM 800 (FIG. 8) to a region of fine alignment. For example, the pads 1212 may have a width of 0.5-1 mm and a spacing of 0.25 mm (corresponding to an external ball grid array or BGA located above the top plate 820, which is coupled to the springs 1210), while pads or connectors on the bottom surface of the interposer plate 818 may have a width of 80 μm and a spacing of 40 μm (i.e., an order of magnitude smaller).

Figure 13:
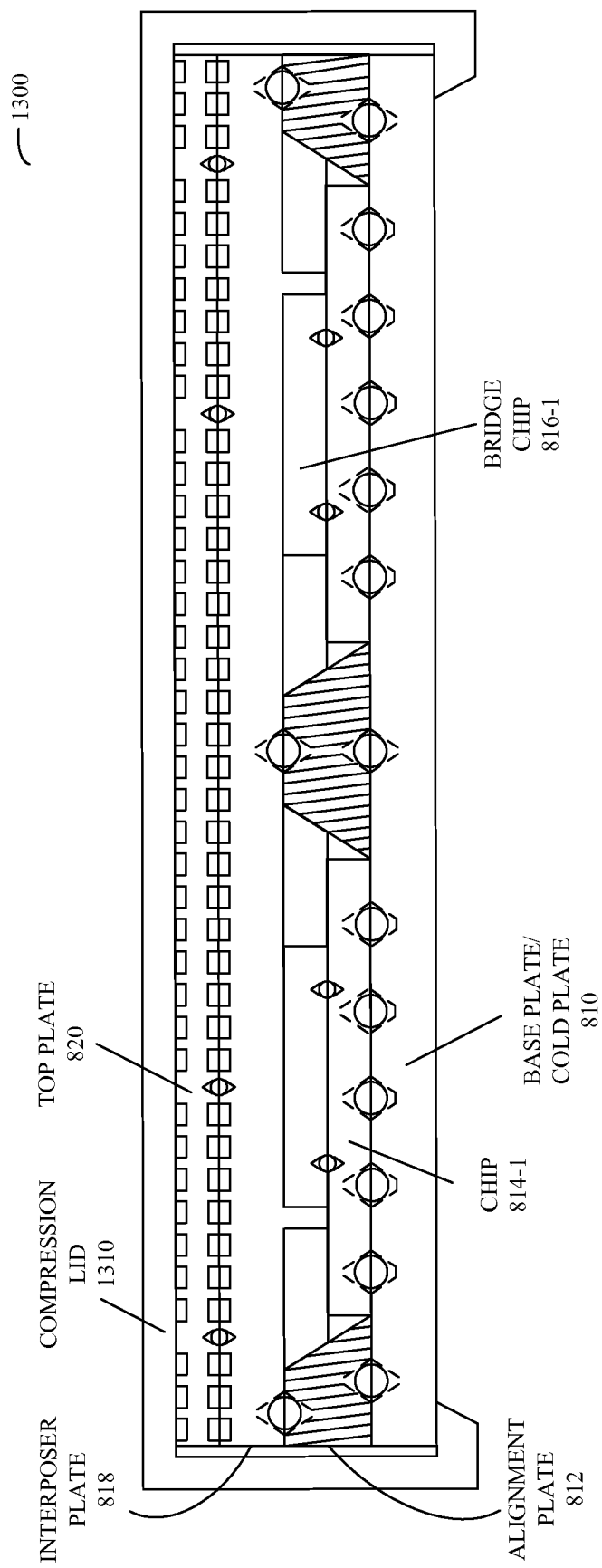
FIG. 13 is a block diagram illustrating an MCM in accordance with an embodiment of the present invention.

FIG. 13 presents a block diagram illustrating a side view of an assembled MCM 1300. In this MCM, a compression lid 1310 provides a clamping mechanism that holds the assembly together and, via metallized vias, additionally couples the signals from the top plate 820 to the external BGA so that the MCM 1300 will be compatible with existing BGA packing. For example, a grid of solder balls (not shown) may be positioned on top of the compression lid 1310. Note that by reflowing these solder balls the MCM 1300 may coupled to a circuit board.

Compression lid 1310 provides a clamping force that holds the complete assembly, from the base-plate/cold plate 810 to the top plate 820, in intimate contact. Consequently, microspheres are held in the alignment pits, the chips 814 are held in the wells 940 (FIG. 9B), and the chips 814 and the bridge chips 816 are all clamped in their respective locked positions and precise global alignment is maintained. Furthermore, lateral and vertical displacement of the internal components is reduced under typical vibration and mechanical shock conditions. This compression lid also maintains low resistance electrical connections between pads, springs, and connectors in the MCM 1300. And the compression lid 1310 provides environmental protection for the internal components, thereby guarding against exposure to: humidity, corrosive vapors, and debris.

In an exemplary embodiment, the MCM 1300 has a thickness of 2.5 mm. Moreover, the compression lid 1310 provides a uniform force of 1-2 kg or 1-5 pounds. For example, the compression lid 1310 may have catenary or parabolic shape prior to assembly. This bowed equilibrium shape helps to distribute the force uniformly over the entire array of internal components in the MCM 1300. In some embodiments, bolts (not shown) are also used to secure the MCM 1300.

Note that in some embodiments the compression lid 1310 includes one or more holes to allow an optical fiber and/or a ribbon cable to access the MCM 1300. Moreover, holes may also be etched in the top plate 820 and/or the interposer plate 818. In some embodiments, the cable may be coupled to: voltage regulators, memory (such as random access memory), and/or storage devices (such as disc drives).

In the discussion thus far, the components in the MCM 1300 do not need to be soldered or permanently connected to each other. This flexibility allows the MCM 1300 to be reworked during testing (for example, defective components may be replaced by partially disassembling the MCM 1300). Note that, because circuits on one or more chips 814 in the MCM 1300 may implement the functionality of an entire computer system, self-testing of the MCM 1300 may be more thorough, thereby offering improved identification of (any) defective components.

We now describe embodiments of a process for assembling an MCM. FIG. 14 provides a flow chart illustrating a process 1400 for assembling an MCM. During this process, a first semiconductor die is positioned into a first negative feature in an alignment plate in the MCM (1410), where the positioning involves coupling the first semiconductor die to the base plate in the MCM using first coupling elements. Then, a second semiconductor die is positioned into a second negative feature in the alignment plate (1412), where the positioning involves coupling the second semiconductor die to the base plate using second coupling elements. Next, the first semiconductor die is coupled to the second semiconductor die using third coupling elements (1414). Note that given coupling elements, which can include the first coupling elements, the second coupling elements, or the third coupling elements, facilitate aligning of proximity connectors proximate to a first surface of the first semiconductor die with proximity connectors proximate to a second surface of the second semiconductor die.

In some embodiments of the processes 1400 there may be additional or fewer operations, the order of the operations may be changed, and two or more operations may be combined into a single operation.

Figure 15:
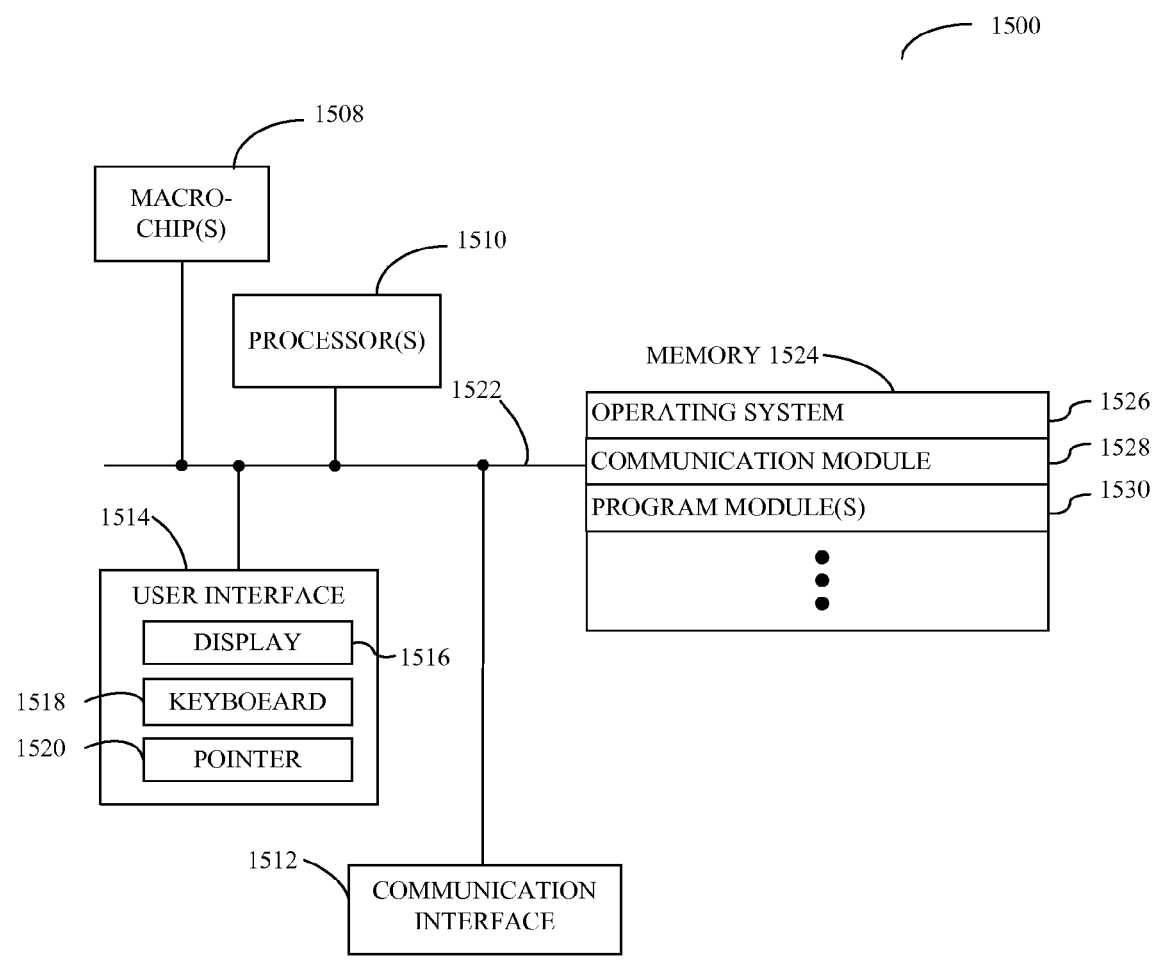
FIG. 15 is a block diagram illustrating a computer system in accordance with an embodiment of the present invention.

Note that the MCMs described previously may be included in systems. For example, FIG. 15 presents a block diagram illustrating an embodiment of a computer system 1500, which includes one or more processors 1510, a communication interface 1512, a user interface 1514, and one or more signal lines 1522 coupling these components together. Note that the one or more processing units 1510 may support parallel processing and/or multi-threaded operation, the communication interface 1512 may have a persistent communication connection, and the one or more signal lines 1522 may constitute a communication bus. Moreover, the user interface 1514 may include: a display 1516, a keyboard 1518, and/or a pointer, such as a mouse 1520.

Computer system 1500 may include memory 1524, which may include high speed random access memory and/or non-volatile memory. More specifically, memory 1524 may include: ROM, RAM, EPROM, EEPROM, FLASH, one or more smart cards, one or more magnetic disc storage devices, and/or one or more optical storage devices. Memory 1524 may store an operating system 1526, such as SOLARIS, LINUX, UNIX, OS X, or WINDOWS, that includes procedures (or a set of instructions) for handling various basic system services for performing hardware dependent tasks. Memory 1524 may also store procedures (or a set of instructions) in a communication module 1528. The communication procedures may be used for communicating with one or more computers and/or servers, including computers and/or servers that are remotely located with respect to the computer system 1500.

Memory 1524 may also include the one or more program modules (of sets of instructions) 1530. Instructions in the program modules 1530 in the memory 1524 may be implemented in a high-level procedural language, an object-oriented programming language, and/or in an assembly or machine language. The programming language may be compiled or interpreted, i.e., configurable or configured to be executed by the one or more processing units 1510.

Computer system 1500 may include one or more macrochips 1508 (such as one or more MCMs) that include semiconductor dies and/or components as described in the previous embodiments.

Computer system 1500 may include fewer components or additional components, two or more components may be combined into a single component, and/or a position of one or more components may be changed. In some embodiments, the functionality of the computer system 1500 may be implemented more in hardware and less in software, or less in hardware and more in software, as is known in the art.

Although the computer system 1500 is illustrated as having a number of discrete items, FIG. 15 is intended to be a functional description of the various features that may be present in the computer system 1500 rather than as a structural schematic of the embodiments described herein. In practice, and as recognized by those of ordinary skill in the art, the functions of the computer system 1500 may be distributed over a large number of servers or computers, with various groups of the servers or computers performing particular subsets of the functions. In some embodiments, some or all of the functionality of the computer system 1500 may be implemented in one or more application specific integrated circuits (ASICs) and/or one or more digital signal processors (DSPs).

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A multi-chip module (MCM), comprising:
a first semiconductor die and a second semiconductor die, wherein a given semiconductor die, which can be the first semiconductor die or the second semiconductor die, includes proximity connectors proximate to a surface of the given semiconductor die, and wherein the given semiconductor die is configured to communicate signals with the other semiconductor die via proximity communication through one or more of the proximity connectors;
an alignment plate including a first negative feature configured to accommodate the first semiconductor die and a second negative feature configured to accommodate the second semiconductor die;
an interposer plate coupled to the alignment plate, wherein the interposer plate includes a positive feature, and wherein the interposer plate includes connectors to couple signals from a top surface of the interposer plate to a bottom surface of the interposer plate;
a top plate coupled to the interposer plate, wherein the top plate couples signals from a top surface of the top plate to the top surface of the interposer plate; and
a compression lid coupled to the top plate and the alignment plate, wherein the compression lid is configured to provide a clamping force to hold the alignment plate and the top plate in contact;
wherein the positive feature is coupled to the first semiconductor die; and
wherein the positive feature facilitates mechanical positioning of the first semiconductor die.

2. The MCM of claim 1, wherein the mechanical positioning defines relative positions of the proximity connectors proximate to the surface of the first semiconductor die and the proximity connectors proximate to the surface of the second semiconductor die, wherein the relative positions are within a first pre-determined distance in a plane which includes the proximity connectors proximate to the surface of the first semiconductor die, and wherein the relative positions are within a second pre-determined distance in a direction which is substantially perpendicular to the plane.

3. The MCM of claim 1, further comprising a component coupled to the proximity connectors proximate to the surface of the first semiconductor die and coupled to the proximity connectors proximate to the surface of the second semiconductor die.

4. The MCM of claim 3, wherein the component is coupled to the given semiconductor die using a set of coupling elements.

5. The MCM of claim 4, wherein the set of coupling elements includes micro-spheres.

6. The MCM of claim 1, wherein the surface of the first semiconductor die faces the surface of the second semiconductor die.

7. The MCM of claim 1, wherein the proximity communication includes optical communication.

8. The MCM of claim 1, wherein the proximity connectors proximate to the surface of the first semiconductor die are capacitively coupled to the proximity connectors proximate to the surface of the second semiconductor die.

9. The MCM of claim 1, wherein the positive feature includes a protrusion, and wherein at least a portion of the protrusion has a pyramidal shape.

10. The MCM of claim 1, wherein a given negative feature, which can include the first negative feature or the second negative feature, includes a depression, and wherein at least a portion of the depression has a pyramidal shape.

11. The MCM of claim 1, further comprising a base plate coupled to the alignment plate, wherein the first semiconductor die is coupled to the base plate using a set of coupling elements which facilitate the mechanical positioning.

12. The MCM of claim 11, wherein the set of coupling elements includes micro-spheres.

13. The MCM of claim 12, wherein the micro-spheres are positioned into depressions in the base plate and depressions in the alignment plate.

14. The MCM of claim 11, wherein the set of coupling elements further facilitates an orientation of the first semiconductor die.

15. The MCM of claim 11, wherein the base plate is configured to cool from the first semiconductor die.

16. The MCM of claim 1, wherein the first semiconductor die is coupled to the second semiconductor die using a set of coupling elements which facilitate the mechanical positioning.

17. The MCM of claim 16, wherein the set of coupling elements includes micro-spheres.

18. The MCM of claim 1, wherein the top plate includes first connectors having a first size on a first surface of the top plate and second connectors having a second size on a second surface of the top plate;
wherein the top plate is configured to couple the first connectors to the given semiconductor die and to couple the first connectors to second connectors; and
wherein the second size is larger than the first size.

19. The MCM of claim 1, wherein the compression lid includes one or more holes, wherein at least one optical fiber or ribbon cable are routed through each of the holes and coupled to the MCM.

* * * * *